(12) United States Patent
Liang et al.

(10) Patent No.: US 11,923,455 B2
(45) Date of Patent: Mar. 5, 2024

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Chun-Sheng Liang, Changhua County (TW); Kuo-Hua Pan, Hsinchu (TW); Hsin-Che Chiang, Taipei (TW); Ming-Heng Tsai, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 34 days.

(21) Appl. No.: 17/343,776

(22) Filed: Jun. 10, 2021

(65) Prior Publication Data
US 2021/0305421 A1    Sep. 30, 2021

Related U.S. Application Data

(63) Continuation of application No. 16/515,020, filed on Jul. 17, 2019, now Pat. No. 11,038,059.

(60) Provisional application No. 62/712,229, filed on Jul. 31, 2018.

(51) Int. Cl.
| | |
|---|---|
| *H01L 29/78* | (2006.01) |
| *H01L 21/8234* | (2006.01) |
| *H01L 29/06* | (2006.01) |
| *H01L 29/417* | (2006.01) |
| *H01L 29/66* | (2006.01) |

(52) U.S. Cl.
CPC .... *H01L 29/785* (2013.01); *H01L 21/823431* (2013.01); *H01L 29/0653* (2013.01); *H01L 29/41791* (2013.01); *H01L 29/66795* (2013.01)

(58) Field of Classification Search
CPC ............... H01L 29/785; H01L 29/0653; H01L 29/41791; H01L 29/66795
USPC ....................................................... 257/365
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Dzung Tran
(74) *Attorney, Agent, or Firm* — JCIPRNET

(57) ABSTRACT

A semiconductor device and method of forming the same are disclosed. The semiconductor device includes a fin structure, a gate electrode, a source-drain region, a plug and a hard mask structure. The gate electrode crosses over the fin structure. The source-drain region in the fin structure is aside the gate electrode. The plug is disposed over and electrically connected to the gate electrode. The hard mask structure surrounds the plug and is disposed over the gate electrode, wherein the hard mask structure includes a first hard mask layer and a second hard mask layer, the second hard mask layer covers a sidewall and a top surface of the first hard mask layer, and a material of the first hard mask layer is different from a material of the second hard mask layer.

20 Claims, 20 Drawing Sheets

(56) References Cited

U.S. PATENT DOCUMENTS

| | | |
|---|---|---|
| 9,576,814 B2 | 2/2017 | Wu et al. |
| 2006/0199321 A1* | 9/2006 | Lo .................... H01L 29/78636 |
| | | 257/E29.147 |
| 2015/0187896 A1* | 7/2015 | Kamineni ......... H01L 21/76816 |
| | | 438/666 |

* cited by examiner

SEMICONDUCTOR DEVICE AND METHOD OF FORMING THE SAME

CROSS-REFERENCE TO RELATED APPLICATION

This application is a continuation application of and claims the priority benefits of a prior application Ser. No. 16/515,020, filed on Jul. 17, 2019. The prior application Ser. No. 16/515,020 claims the priority benefits of U.S. provisional application Ser. No. 62/712,229, filed on Jul. 31, 2018. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the variation of contact resistance such as gate contact resistance, source contact resistance and drain contact resistance. Although existing field-effect transistors and methods of forming field-effect transistors have been generally adequate for their intended purposes, they have not been entirely satisfactory in all respects.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
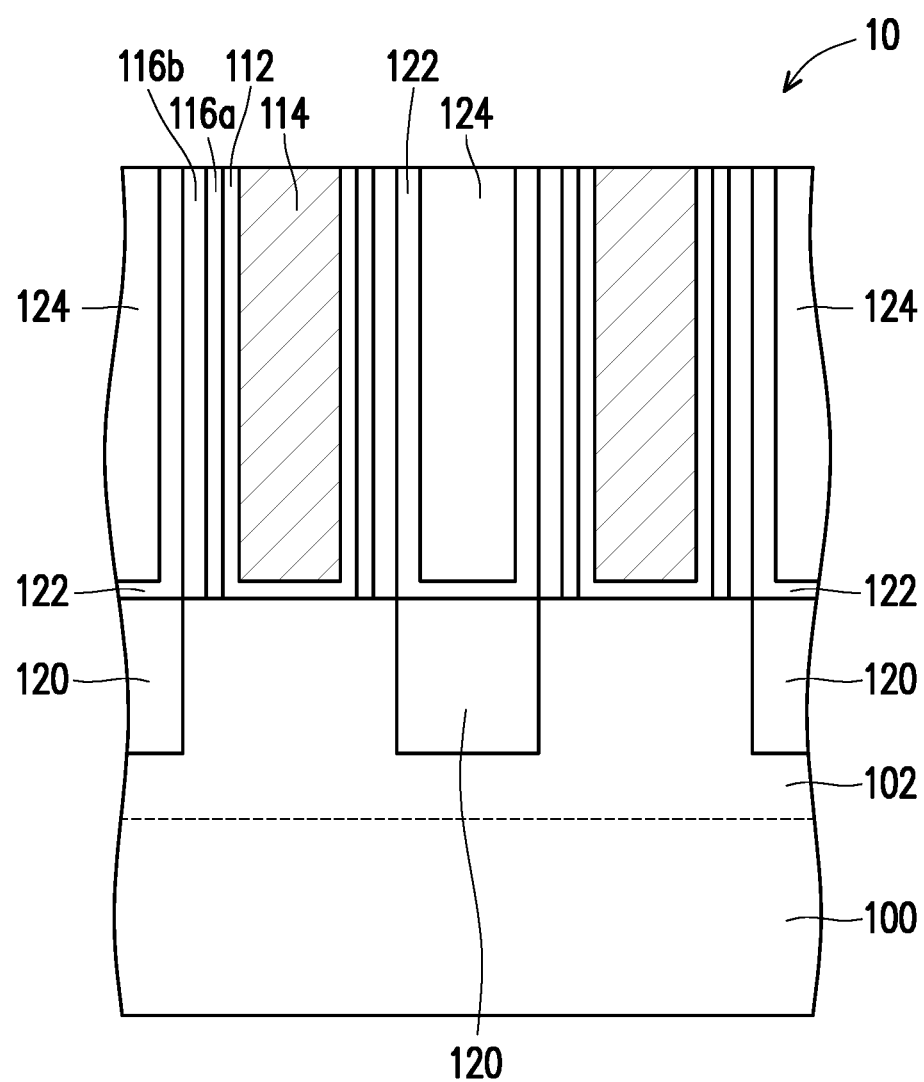
FIGS. 1A to 1J are cross-sectional views at various stages of forming a semiconductor device in accordance with some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing processes of a three-dimensional structure with height differences and the structure(s) fabricated there-from. Certain embodiments of the present disclosure describe the exemplary manufacturing process of one or more FinFETs and the FinFETs fabricated there-from, where the FinFETs may also referred to as a semiconductor device herein. The FinFET may be formed on bulk silicon substrates in certain embodiments of the present disclosure. Still, the FinFET may be formed on a silicon-on-insulator (SOI) substrate as alternatives. Also, in accordance with the embodiments, the silicon substrate may include other conductive layers or other semiconductor elements, such as transistors, diodes or the like. The embodiments are not limited in this context.

FIGS. 1A to 1I are cross-sectional views at various stages of forming a semiconductor device 10 in accordance with some embodiments of the present disclosure. In some embodiments, the semiconductor device 10 is a field-effect transistor such as a fin field-effect transistor (FinFET). The FinFET refers to any fin-based, multi-gate transistor. In alternative some embodiments, the field-effect transistor may be a planar metal-oxide-semiconductor field-effect transistor (MOSFET). Other transistor structures and analogous structures, such as gate-all-around (GAA) field-effect transistor or tunneling field-effect transistor (TFET), are within the contemplated scope of the disclosure. The field-effect transistor may be included in a microprocessor, memory cell, and/or other integrated circuit (IC). In some embodiments, the semiconductor device 10 is a long channel field-effect transistor. In alternative some embodiments, the semiconductor device 10 is a short channel field-effect transistor.

In addition, the semiconductor device 10 of FIGS. 1A to 1I may be further processed using CMOS technology processing. Accordingly, it is understood that additional processes may be provided before, during, and after the method for forming the semiconductor device of FIGS. 1A to 1I, and that some other processes may only be briefly described herein. Also, FIGS. 1A to 1I are simplified for a better understanding of the concepts of the present disclosure. For example, although the figures illustrate the interconnect structure of a field-effect transistor, it is understood the field-effect transistor may be part of an IC that further includes a number of other devices such as resistors, capacitors, inductors, fuses, etc.

Referring to FIG. 1A, a substrate 100 is provided. In some embodiments, the substrate 100 includes a crystalline silicon substrate (e.g., wafer). The substrate 100 may include various doped regions depending on design requirements (e.g., p-type substrate or n-type substrate). In some embodiments, the doped regions may be doped with p-type and/or n-type dopants. For example, the doped regions may be doped with p-type dopants such as boron or $BF_2$, n-type dopants such as phosphorus or arsenic and/or combinations thereof. The doped regions may be configured for an n-type FinFET, a p-type FinFET or the combination thereof. In alternative some embodiments, the substrate 100 may be made of some other suitable elemental semiconductor such as diamond or germanium, a suitable compound semiconductor such as gallium arsenide, silicon carbide, indium arsenide or indium phosphide, or a suitable alloy semiconductor such as silicon germanium carbide, gallium arsenic phosphide or gallium indium phosphide.

As shown in FIG. 1A, at least one fin structure 102 is formed on and/or in the substrate 100. In some embodiments, portions of the substrate 100 are removed to define the fin structure 102 protruding from the substrate 100. In some embodiments, the substrate 100 and the fin structure 102 are integrally formed, that is, there is no boundary between the substrate 100 and the fin structure 102. However, other techniques for fabricating the fin structure 102 are possible. In some embodiments, the substrate 100 and the fin structure 102 are made of the same material.

In some embodiments, an isolation structure (not shown) is formed between the fin structures 102, such as a local oxidation of silicon (LOCOS) or a shallow trench isolation (STI) structure. The isolation structure is configured to isolate the two fin structures 102. The isolation structure may be formed by filling a trench between the fin structures 102 with a dielectric material. In some embodiments, the dielectric material may include $SiO_2$, SiN, SiON, fluoride-doped silicate glass (FSG), a spin-on dielectric material, a low-k dielectric material, any other suitable dielectric material or a combination thereof. The dielectric material may be formed by high-density-plasma chemical vapor deposition (HDP-CVD), sub-atmospheric CVD (SACVD) or by spin-on. In some embodiments, the isolation structure may have a multi-layer structure such as a thermal oxide liner layer filled with SiN or $SiO_2$.

In some embodiments, the fin structure 102 is an active region. In some alternative embodiments, the active regions may be formed in the substrate 100 and include various doping configurations depending on design requirements as known in the art. In some alternative embodiments, the active region may be doped with p-type or n-type dopants. For example, the active regions may be doped with p-type dopants such as boron or $BF_2$, n-type dopants such as phosphorus or arsenic and/or combinations thereof. The active regions may be configured for an N-type metal-oxide-semiconductor field-effect transistor (referred to as an NMOSFET), or alternatively configured for a P-type metal-oxide-semiconductor field-effect transistor (referred to as a PMOSFET).

A plurality of gate structures 110 are disposed on the fin structure 102 and cross over the fin structure 102, as shown in FIG. 1A. Each gate structure 110 includes a gate dielectric layer 112, a gate electrode 114 and a spacer 116. The gate dielectric layer 112 is disposed between the fin structure 102 and the gate electrode 114 and between the gate electrode 114 and the spacer 116, but the disclosure is not limited thereto. In some alternative embodiments, the gate dielectric layer 112 is disposed between the fin structure 102 and the gate electrode 114, and the spacer 116 is in contact with the gate electrode 114. The cross section in FIG. 1A shows each gate structure 110 being located above the fin structure 102. However, in another cross section taken along another direction, each gate structure 110 continuously covers on the sidewalls and the top surfaces of the fin structures 102.

In some embodiments, the material of the gate dielectric layer 112 includes $SiO_2$, SiN, high-k dielectrics, or a combination thereof. High-k dielectrics include metal oxides. Examples of the metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the material of the gate dielectric layer 112 may be mixture of $SiO_2$ and $HfO_2$. In some embodiments, the gate dielectric layer 112 has a thickness in the range of about 1 nanometer to about 5 nanometers. In some embodiments, the method of forming the gate dielectric layer 112 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. In some embodiments, the gate dielectric layer 112 may further include an interfacial layer (not shown) to minimize stress between the gate dielectric layer 112 and the fin structure 102. The interfacial layer may be formed of $SiO_2$ or SiON grown by a thermal oxidation process. For example, the interfacial layer can be grown by a rapid thermal oxidation (RTO) process or in an annealing process including oxygen.

In some embodiments, the gate electrode 114 is single-layer structure. In some alternative embodiments, the gate electrode 114 is multi-layer structure. In some embodiments, the material of the gate electrode 114 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the method of forming the gate electrode 114 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. Moreover, the gate electrode 114 may further include a barrier layer, a work function layer, a liner layer, an interface layer, a seed layer, an adhesion layer, etc.

In some embodiments, in each gate structure 110, the spacer 116 is disposed adjacent to the two sides of the gate electrode 114. The spacer 116 includes a spacer layer 116a and a spacer layer 116b. The spacer layer 116b is formed around the spacer layer 116a. In some embodiments, the material of the spacer layer 116a is different from the material of the spacer layer 116b. In some embodiments, the material of the spacer layer 116a includes $SiO_2$, SiN, SiON, SiCN or other suitable material, and the material of the spacer layer 116b includes $SiO_2$, SiN, SiON, SiCN, silicon carbide oxynitride (SiCON) or other suitable material. In some embodiments, the material of the spacer layer 116a may be SiCON, and the material of the spacer layer 116b may be SiON. In some embodiments, the spacer layer 116a has a thickness in the range of about 1 nanometer to about 4 nanometers. In some embodiments, the spacer layer 116b has a thickness in the range of about 1 nanometer to about 4 nanometers. In some embodiments, the method of forming the spacer layer 116a and the method of forming the spacer layer 116b may respectively include a deposition process and then an etching process. The deposition process may include atomic layer deposition (ALD), molecular beam deposition (MBD), chemical vapor deposition (CVD), physical vapor deposition (PVD), flowable chemical vapor deposition (FCVD), or a combination thereof. The etching process may include an anisotropic etching process or other suitable process. In addition, although the spacer 116 is a double-layer spacer, the disclosure is not limited thereto. In some alternative embodiment, the spacer 116 may be a single-layer spacer.

A source-drain region 120 is disposed in the fin structure 102 and/or the substrate 100 aside each gate structure 110. In some embodiments, the source-drain region 120 is disposed adjacent to the two sides of each spacer 116. In some embodiments, portions of the fin structure 102 are removed to form recesses using photolithography and etching processes, and then, the source-drain region 120 is formed by being implanted after being epitaxially (epi) grown in the recesses. The source-drain region 120 is located within the recesses and has a top surface which is substantially flush with or coplanar with a top surface of the fin structure 102. However, the disclosure is not limited thereto; in some alternative embodiments, the source-drain region 120 protrudes from the recesses and has a top surface higher than a top surface of the fin structure 102. In some embodiments, the source-drain region 120, such as silicon germanium (SiGe), is epitaxial-grown by a LPCVD process to form the source and drain of the p-type FinFET (or the PMOSFET). In alternative some embodiments, the source-drain region 120, such as silicon carbon (SiC), is epitaxial-grown by a LPCVD process to form the source and drain of the n-type FinFET (or the NMOSFET). In addition, although the source-drain region 120 is shaped as a rectangle, the disclosure is not limited thereto. In some alternative embodiment, the source-drain region 120 may be shaped as a diamond or other suitable shape. In some embodiments, the source-drain region 120 is optionally formed with silicide top layer (not shown) by silicidation.

A contact etch stop layer (CESL) 122 is disposed aside each gate structure 110. In some embodiments, the CESL 122 is disposed on sidewalls of each gate structure 110 and extended onto the source-drain region 120. The CESL 122 protects the gate structures 110 from being damaged during contact etching. In some embodiments, the CESL 122 is in contact with each spacer 116. In other words, the spacer 116 is disposed between the corresponding gate electrode 114 and the CESL 122. In some embodiments, the CESL 122 has a top surface substantially flush with or coplanar with a top surface of each gate structure 110. That is, the CESL 122 has a top surface substantially flush with or coplanar with a top surface of each gate dielectric layer 112, a top surface of each gate electrode 114 and a top surface of each spacer 116. In some embodiments, the material of the CESL 122 includes SiCON, SiN, SiCN, SiON, or a combination thereof. In some embodiments, the material of the CESL 122 may be SiN. In some embodiments, the method of forming the CESL 122 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process.

An interlayer dielectric 124 is disposed over the CESL 122. In some embodiments, the material of the interlayer dielectric 124 is different from the material of the CESL 122. In some embodiments, the interlayer dielectric 124 has a different etch selectivity from the CESL 122. In some embodiments, the material of the interlayer dielectric 124 includes $SiO_2$, SiN, SiON, SiCN or other suitable material. In some embodiments, the material of the interlayer dielectric 124 may be $SiO_2$. In some embodiments, the interlayer dielectric 124 has a top surface substantially flush with or coplanar with a top surface of each gate structure 110 and a top surface of the CESL 122. That is, the interlayer dielectric 124 has a top surface substantially flush with or coplanar with a top surface of each gate dielectric layer 112, a top surface of each gate electrode 114, a top surface of each spacer 116 and a top surface of the CESL 122. In some embodiments, the method of forming the interlayer dielectric 124 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. In some embodiments, the interlayer dielectric 124 is single-layer structure. In some alternative embodiments, the interlayer dielectric 124 is multi-layer structure.

Figure 1B:
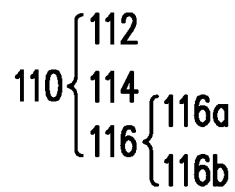
Figure 1B:
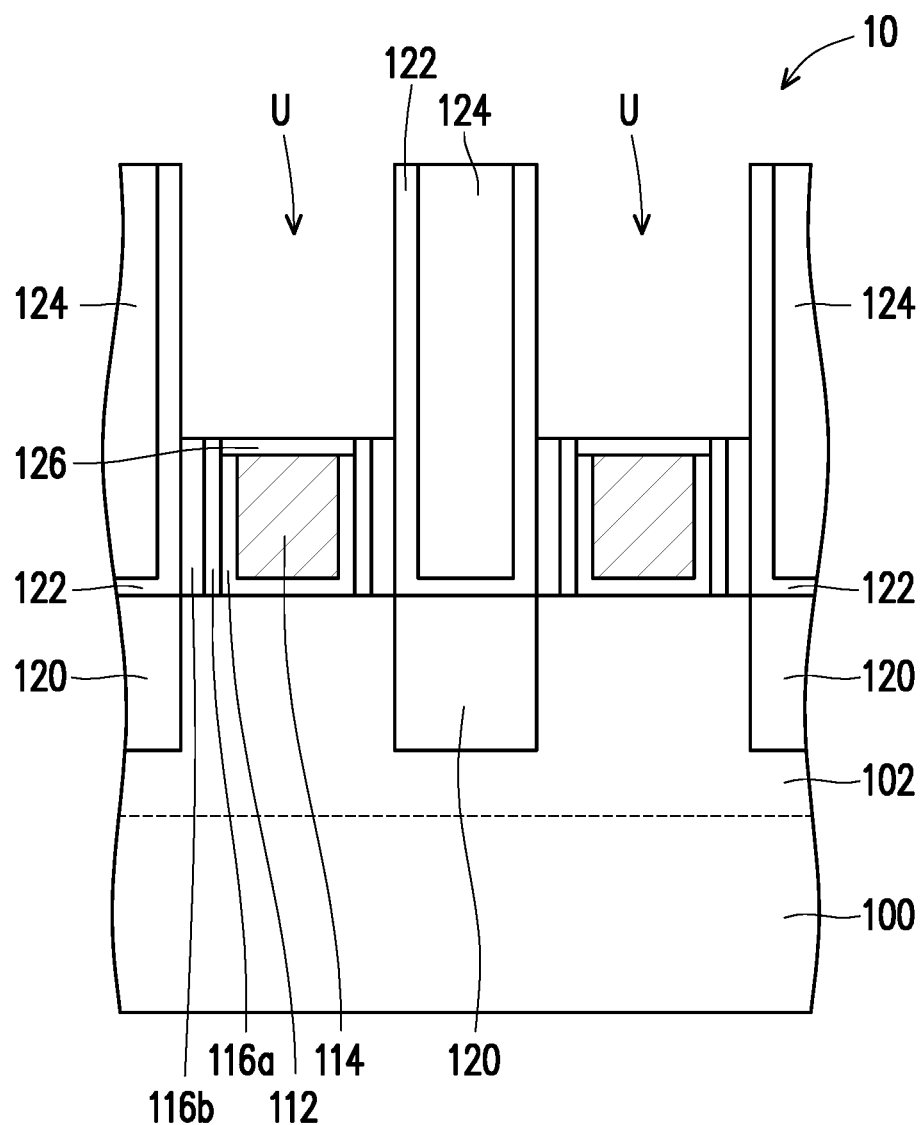

Referring to FIG. 1B, portions of the gate dielectric layers 112, the gate electrodes 114 and the spacers 116 are removed, so as to form recesses U exposing portions of the CESL 122. In some embodiments, after the removing process is performed, each gate structure 110 has a top surface not substantially flush with or coplanar with the top surface of the CESL 122 and the top surface of the interlayer dielectric 124, in other words, each of the gate dielectric layer 112, the gate electrode 114 and the spacer 116 has a top surface not substantially flush with or coplanar with the top surface of the CESL 122 and the top surface of the interlayer dielectric 124. In some embodiments, specifically, each gate structure 110 has a top surface lower than the top surface of the CESL 122 and the top surface of the interlayer dielectric 124. In some embodiments, additionally, after the removing process is performed, the top surface of each spacer 116 is higher than the top surface of each gate dielectric layer 112 and the top surface of each gate electrode 114. However, the disclosure is not limited thereto; in some alternative embodiments, after the removing process is performed, the top surface of each spacer 116 is substantially flush with or coplanar with the top surface of each gate dielectric layer 112 and the top surface of each gate electrode 114.

In some embodiments, the gate dielectric layers 112, the gate electrodes 114 and the spacers 116 may be removed by etching. In some embodiments, the removing process may include one or more than one etching processes. In some embodiments, the gate dielectric layers 112, the gate electrodes 114 and the spacers 116 are removed simultaneously by the same etchant. In some alternative embodiments, the gate dielectric layers 112, the gate electrodes 114 and the spacers 116 are removed by different etchants. In addition, during the removing process, the CESL 122 and the interlayer dielectric 124 are not removed with respect to the removals of the gate dielectric layers 112, the gate electrodes 114 and the spacers 116 due to the specific etching selectivity chosen based on the material differences.

After the portions of the gate dielectric layers 112, the gate electrodes 114 and the spacers 116 are removed, a conductive layer 126 is formed to cover the gate dielectric layers 112 and the gate electrodes 114. In some embodiments, the conductive layer 126 has a top surface substantially flush with or coplanar with the top surface of each spacer 116. However, the disclosure is not limited thereto; in some alternative embodiments, the conductive layer 126 has a top surface not substantially flush with or coplanar with the top surface of each spacer 116. In some embodiments, the material of the conductive layer 126 includes titanium (Ti), tantalum (Ta), tungsten (W), aluminum (Al), titanium aluminum (TiAl), tantalum aluminum (TaAl), tungsten aluminum (WAl), zirconium aluminum (ZrAl), tungsten silicon nitride (WSiN), titanium aluminum carbide (TiAlC), tantalum aluminum carbide (TaAlC), titanium aluminum nitride (TiAlN), tantalum aluminum nitride (TaAlN), or other suitable material. In some embodiments, the material of the conductive layer 126 includes tungsten. In some alternative embodiments, the conductive layer 126 is optional, that is, the conductive layer 126 may be omitted.

Figure 1C:
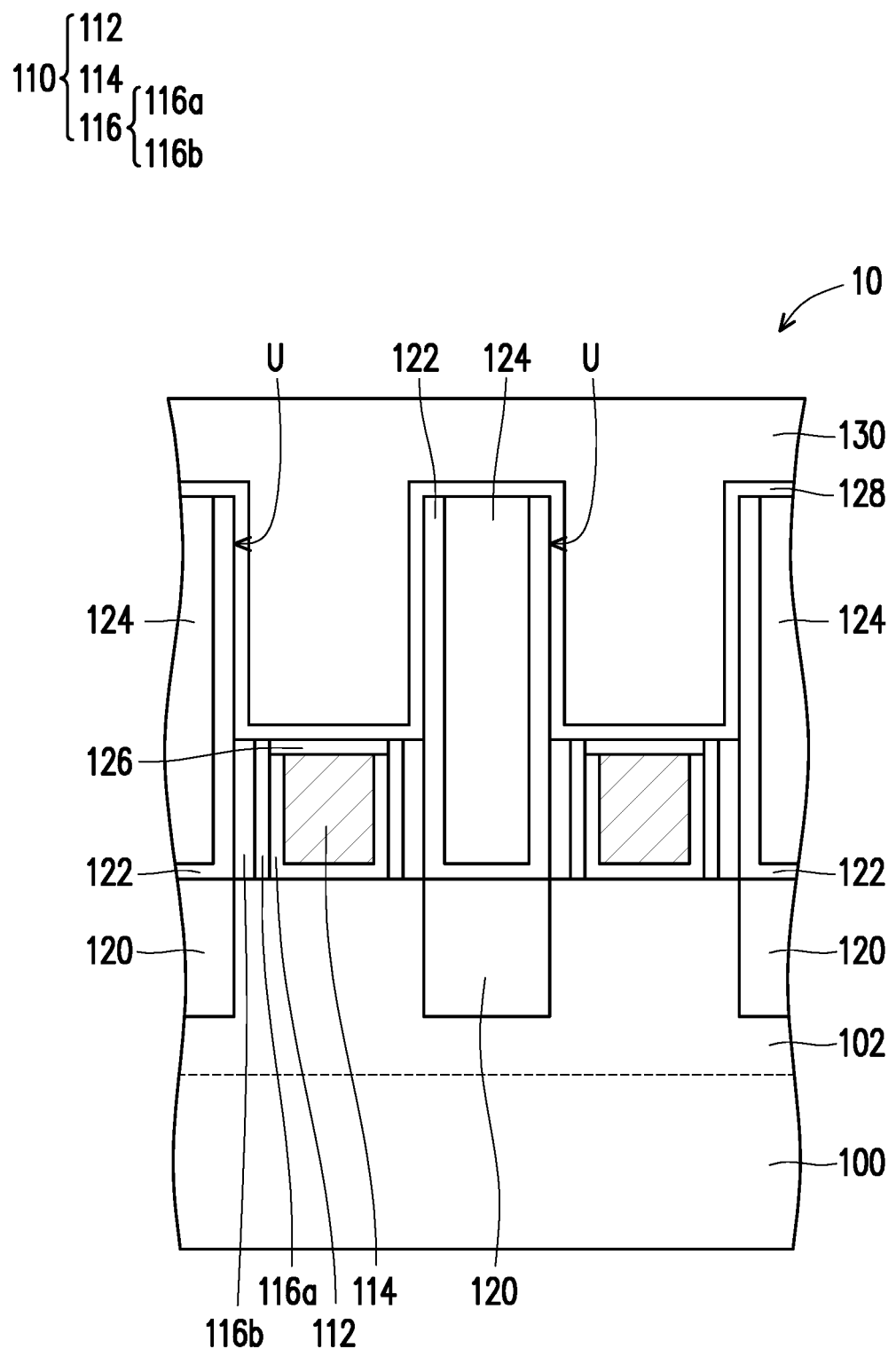

Referring to FIG. 1C, a dielectric layer 128 is formed in the recesses U and over the exposed surfaces of the CESL 122, the interlayer dielectric 124, the gate structure 110 and the conductive layer 126. That is, after the recesses U are formed, the dielectric layer 128 is conformally formed over the substrate 100. In some embodiments, the material of the dielectric layer 128 is different from the material of the interlayer dielectric 124. In some embodiments, the dielectric layer 128 has a different etch selectivity from the interlayer dielectric 124. In some embodiments, the material of the dielectric layer 128 includes SiN, SiON, SiCON, SiCN or other suitable material. In some embodiments, the material of the dielectric layer 128 may be SiN. In some embodiments, the dielectric layer 128 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof. In some embodiments, the dielectric layer 128 has a thickness in the range of about 1 nanometer to about 5 nanometers. In some alternative embodiments, the dielectric layer 128 is optional, that is, the dielectric layer 128 may be omitted.

Then, a material layer 130 is formed over the dielectric layer 128 to fill up the recesses U. In some embodiments, the material of the material layer 130 is different from the materials of the dielectric layer 128, the CESL 122 and the interlayer dielectric 124. In some embodiments, the material layer 130 has a different etch selectivity from the dielectric layer 128, the CESL 122 and the interlayer dielectric 124. In some embodiments, the material of the material layer 130 includes amorphous silicon, polycrystalline silicon, or other suitable material. In some embodiments, the material of the material layer 130 may be amorphous silicon. In some embodiments, the material layer 130 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof.

Figure 1D:
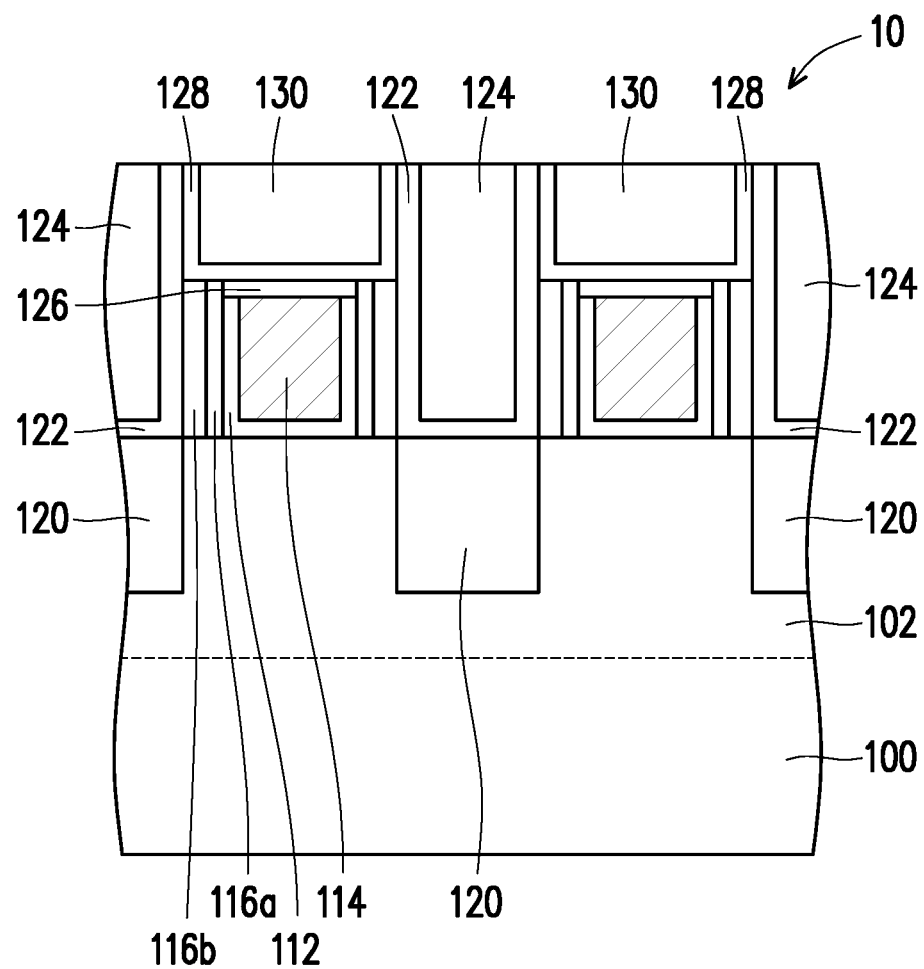

Referring to FIG. 1D, portions of the material layer 130, the dielectric layer 128, the CESL 122 and the interlayer dielectric 124 are removed, so that a top surface of the material layer 130, a top surface of the dielectric layer 128, a top surface of the CESL 122 and a top surface of the interlayer dielectric 124 are substantially flush with or coplanar with each other. In some embodiments, the material layer 130, the dielectric layer 128, the CESL 122 and the interlayer dielectric 124 may be removed by a planarization process. The planarization process may include a chemical mechanical polishing (CMP) process, an etch process, or other suitable process.

Figure 1E:
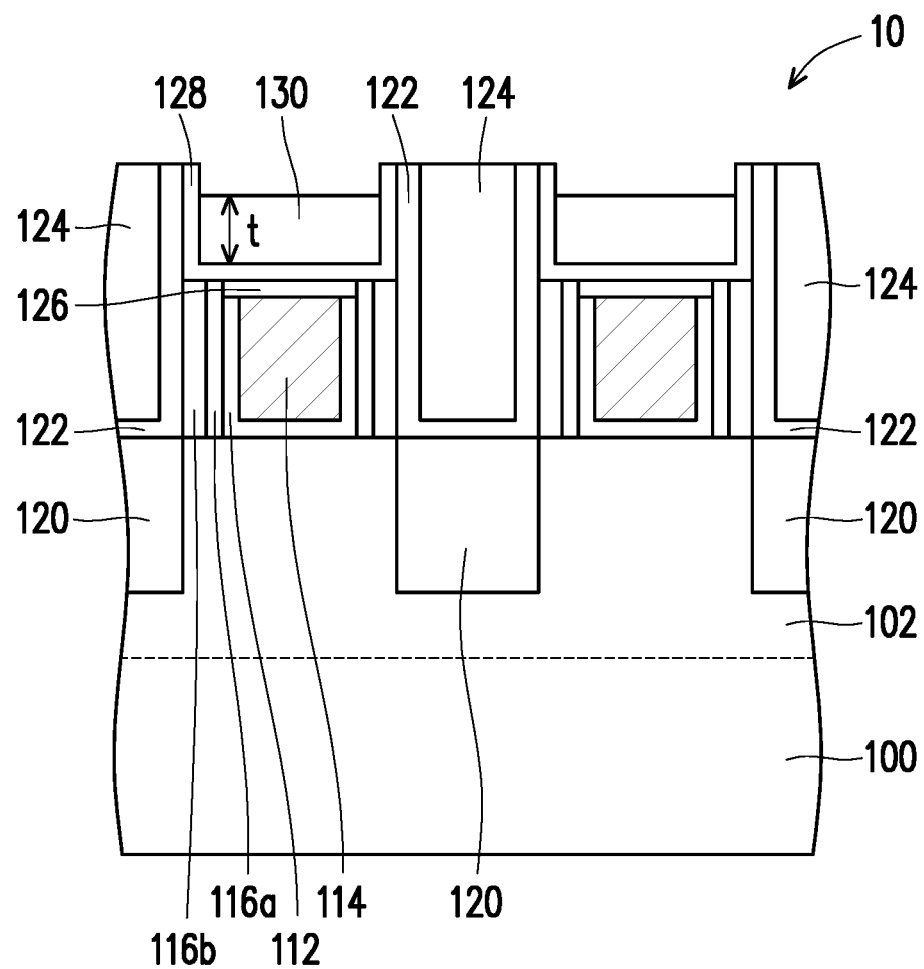

Referring to FIG. 1E, the material layer 130 is further partially removed to have a thickness t, until the material layer 130 has a top surface not substantially flush with or coplanar with the top surface of the dielectric layer 128, the top surface of the CESL 122 and the top surface of the interlayer dielectric 124. In some embodiments, the material layer 130 is disposed over the gate structure 110 and has the top surface lower than the top surfaces of the dielectric layer 128, the CESL 122 and the interlayer dielectric 124. In some embodiments, the material layer 130 may be removed by an etching process. Since the material layer 130 has the different etch selectivity from the dielectric layer 128, the CESL 122 and the interlayer dielectric 124, during the etching process, the dielectric layer 128, the CESL 122 and the interlayer dielectric 124 are not removed with respect to the removal of the material layer 130. In some embodiments, the etching process may include a dry etching process with using fluorine-based gas, or chlorine-based gas as reaction gas. In some alternative embodiments, the etching process may include a wet etching process with $NH_4OH$.

Figure 1F:
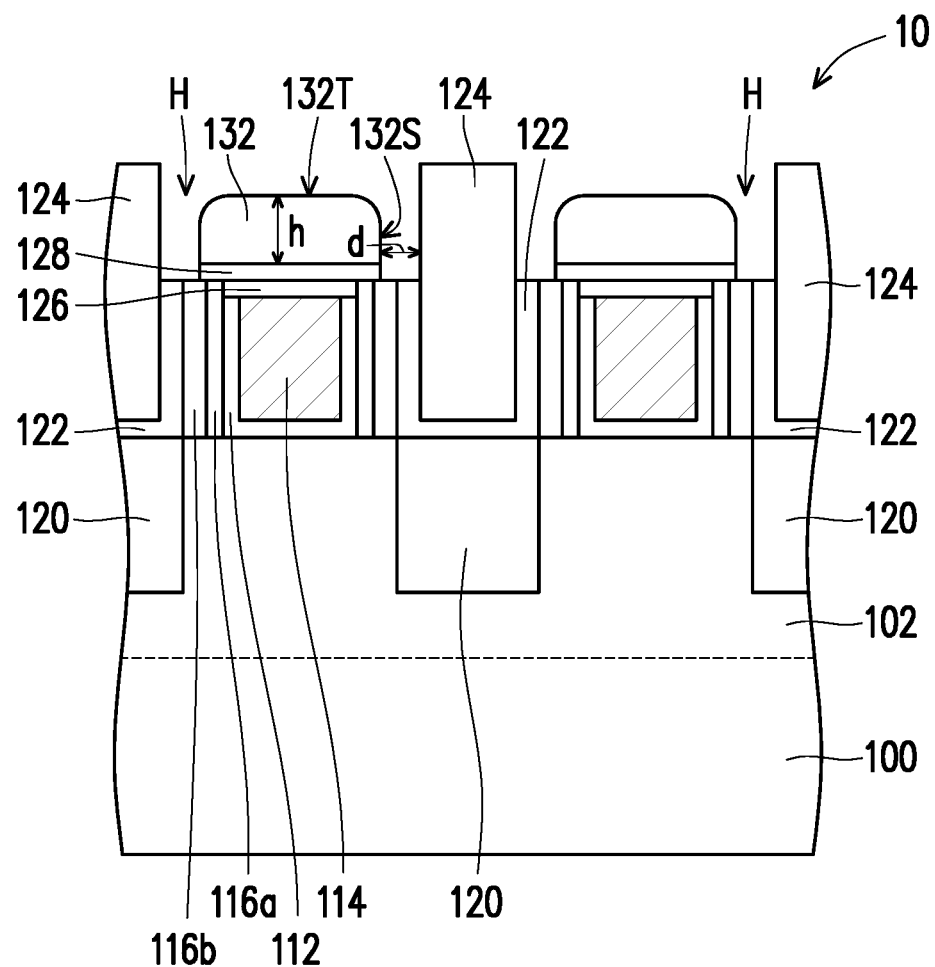

Referring to FIG. 1F, portions of the dielectric layer 128 and the CESL 122 are removed, so as to form patterns 132 over the gate structures 110 and hollow portions H between the patterns 132 and the interlayer dielectric 124. In some embodiments, the hollow portions H expose top surfaces 132T and sidewalls 132S of the patterns 132 and the top surfaces of the spacer 116 and the CESL 122. In some embodiments, the top surface 132T and the sidewall 132S are connected at a top corner. In some embodiments, the dielectric layer 128 and the CESL 122 may be removed by an etching process. In some embodiments, each top corner of each pattern 132 is rounded in the range of about ⅓ Π rad to about ½ Π rad (about 60 degrees to about 90 degrees), each pattern 132 partially covers the top surface of the corresponding spacer 116, and a distance d of about 1 nanometer to about 7 nanometers is between a sidewall of the interlayer dielectric 124 and the sidewall 132S of each pattern 132. To be more specific, since the material layer 130 has the different etch selectivity from the dielectric layer 128 and the CESL 122, during the etching process, the material layer 130 is partially removed to form the patterns 132 with rounded top corners, while the portions of the dielectric layer 128 and the CESL 122 between the interlayer dielectric 124 and the material layer 130 are removed. However, the disclosure is not limited thereto. In some alternative embodiments, at least one top corner of the patterns 132 may be rounded. In some alternative embodiments, the corners of the patterns 132 may not be rounded, which means each corner of the patterns 132 may be sharp corner. It is noted that the term "sharp corner" refers to a corner having angle of about 90° throughout the entire disclosure. In some alternative embodiments, each pattern 132 covers the whole top surface of the corresponding spacer 116. In some alternative embodiments, the distance d of about 1 nanometer to about 3 nanometers is between the sidewall of the interlayer dielectric 124 and the sidewall 132S of each pattern 132. In some embodiments, each pattern 132 has a thickness h in the range of about 5 nanometers to 30 about nanometers. In some embodiments, the thickness h of each pattern 132 is substantially equal to the thickness t of the material layer 130. However, the disclosure is not limited thereto; in some alternative embodiments, after the removing process is performed, the thickness h of each pattern 132 is lower than the thickness t of the material layer 130. In some embodiments, the top surface 132T of each pattern 132 is higher than the top surface of the CESL 122. In some embodiments, after the etching process of the dielectric layer 128 and the CESL 122, the remaining dielectric layer 128 is between each pattern 132 and the corresponding gate structure 110. In addition, since the interlayer dielectric 124 has the different etch selectivity from the dielectric layer 128 and the CESL 122, during the etching process, the interlayer dielectric 124 is not removed with respect to the removals of the dielectric layer 128 and the CESL 122. In some embodiments, the etching process may include a dry etching process with using chlorine-based gas, or $CF_4$-based gas as reaction gas. In some alternative embodiments, the etching process may include a wet etching process with $H_3PO_4$.

Figure 1G:
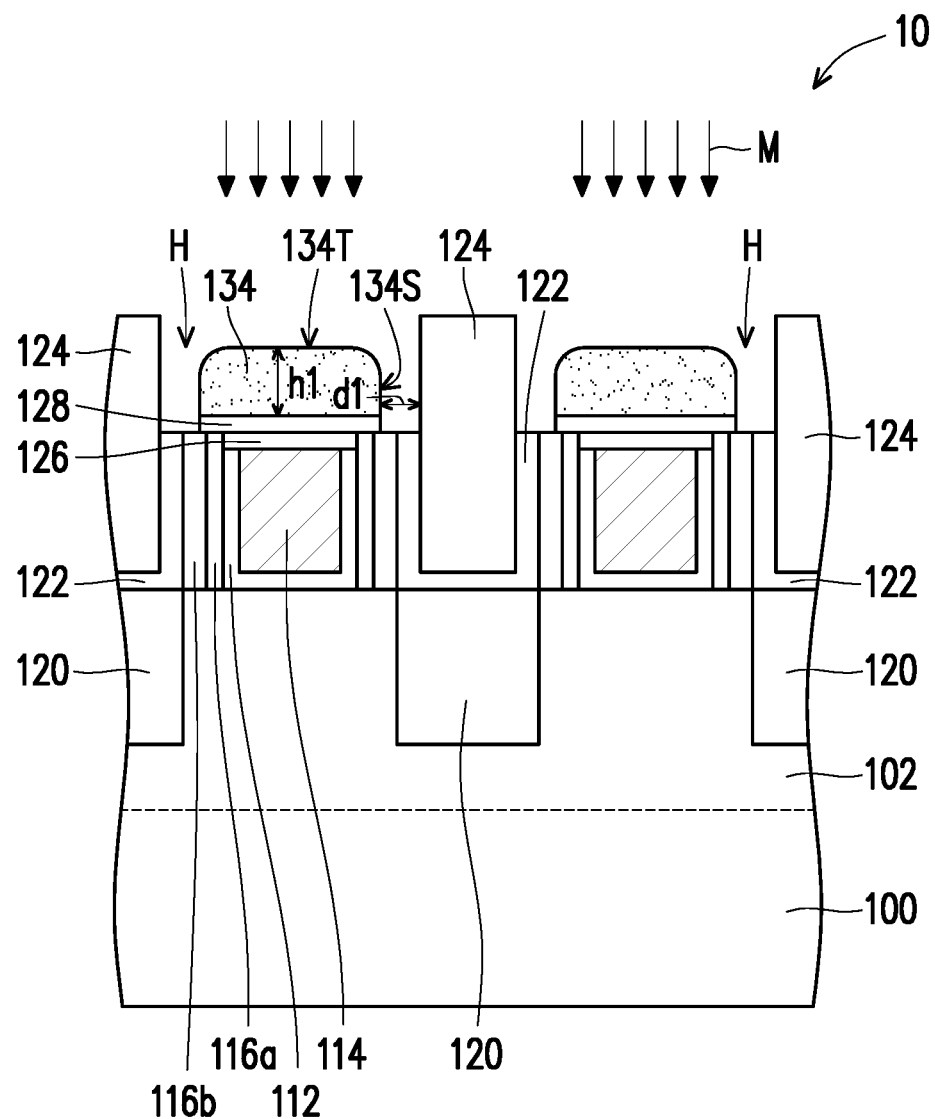

Referring to FIG. 1G, a modification process M is performed to the patterns 132, so as to form hard mask layers 134. In some embodiments, by using a mask, or other suitable components to cover the exposed surfaces of the CESL 122, the interlayer dielectric 124 and the spacers 116, the patterns 132 are modified while the CESL 122, the interlayer dielectric 124 and the spacers 116 are not modified. The modification process M may include ion implantation, ion diffusion, or the combination thereof. In some embodiments, the ion implantation includes nitrogen ion implantation, oxygen ion implantation, or the combination thereof, and the ion diffusion includes decoupled plasma nitridation (DPN), post-nitridation annealing (PNA), decoupled plasma oxidation (DPO), post-oxidation annealing (POA), or the combination thereof. In other words, the modification process M may include nitridation process, oxidation process, or the combination thereof. Also, the material of the hard mask layers 134 may include oxide, nitride, oxy-nitride. In some embodiments, the material of the hard mask layers 134 includes $SiO_2$, SiN, SiON, SiCON or other suitable material. In some embodiments, the material of hard mask layers 134 may be SiN.

In some embodiments, each top corner of each hard mask layer 134 is rounded in the range of about ⅓ Π rad to about ½ Π rad (about 60 degrees to about 90 degrees). However, the disclosure is not limited thereto; in some alternative embodiments, at least one top corner of each hard mask layer 134 may be rounded. In some embodiments, each hard mask layer 134 partially covers the top surface of the corresponding spacer 116. However, the disclosure is not limited thereto; in some alternative embodiments, each hard mask layer 134 covers the whole top surface of the corresponding spacer 116. In some embodiments, a distance d1 of about 1 nanometer to about 7 nanometers is between the sidewall of the interlayer dielectric 124 and the sidewall 134S of each hard mask layer 134. However, the disclosure is not limited thereto; in some alternative embodiments, the distance d1 of about 1 nanometer to about 3 nanometers is between the sidewall of the interlayer dielectric 124 and the sidewall 134S of each hard mask layer 134. In some embodiments, each hard mask layer 134 has a thickness h1 in the range of about 5 nanometers to 30 about nanometers. In some embodiments, the top surface 134T of each hard mask layer 134 is higher than the top surface of the CESL 122. In some embodiments, the dielectric layer 128 is between each hard mask layer 134 and the corresponding gate structure 110.

Figure 1H:
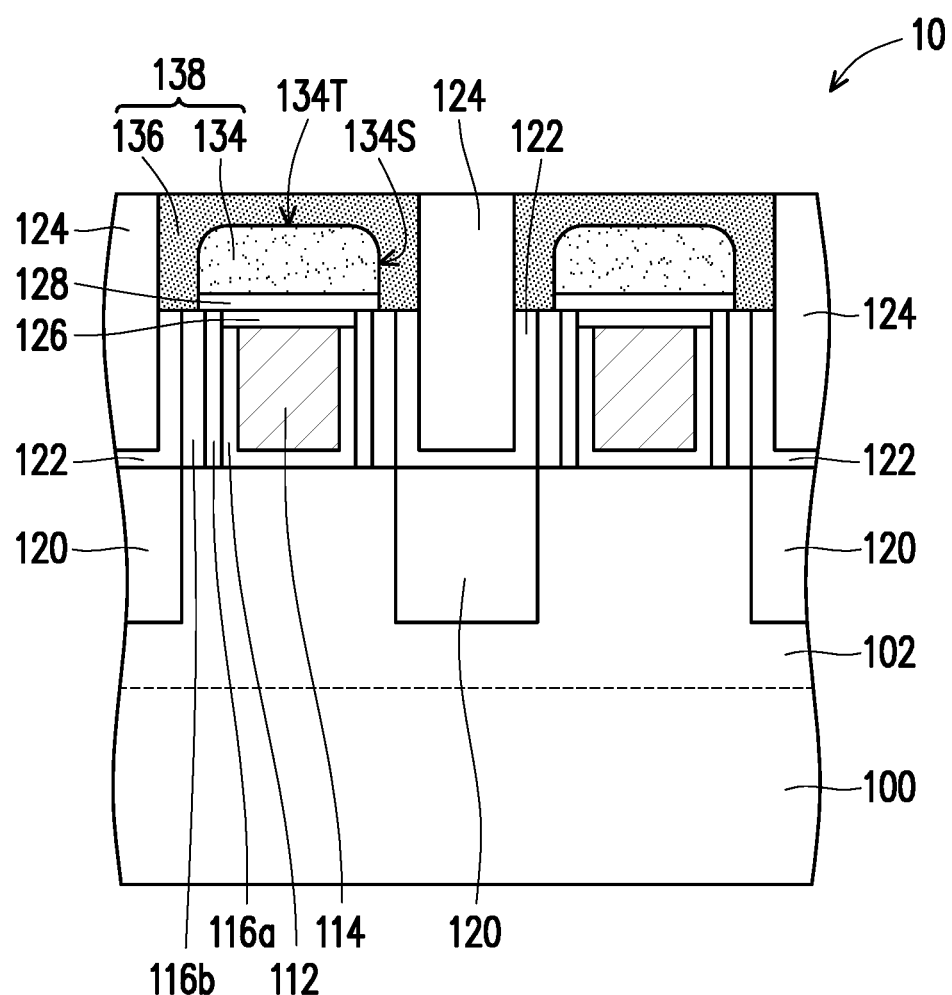

Referring to FIG. 1H, hard mask layers 136 are formed in the hollow portions H to cover the top surfaces 134T and the sidewalls 134S of the hard mask layers 134, and the hard mask layers 136 with the hard mask layers 134 together constitute hard mask structures 138. In other words, each of the hard mask structures 138 includes one hard mask layer 134 and one hard mask layer 136. In some embodiments, the hard mask structures 138 are disposed over the gate structures 110 and the CESL 122. In some embodiments, a top surface of each hard mask structure 138 is substantially flush with or coplanar with a top surface of the interlayer dielectric 124, wherein the top surface of each hard mask structure 138 is a top surface of the corresponding hard mask layer 136. In some embodiments, the material of the hard mask layer 136 is different from the material of the hard mask layer 134. In some embodiments, a k constant of the material of the hard mask layer 134 is lower than a k constant of the material of the hard mask layer 136. In some embodiments, the hard mask layer 136 has a different etch selectivity from the interlayer dielectric 124. In some embodiments, the material of the hard mask layer 136 includes $ZrO_2$, $HfO_2$, $Al_2O_3$, $Y_2O_3$ or other suitable material. In some embodiments, the material of the hard mask layer 136 may be $ZrO_2$. Owing to the hard mask layer 134 and the hard mask layer 136, the semiconductor device 10 has the reduced capacitance, thereby enhancing the electric performance of the semiconductor device 10. In some embodiments, the method of forming the hard mask layers 136 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may be performed by using the top surface of the interlayer dielectric 124 as a stop layer and may include a chemical mechanical polishing (CMP) process, an etch process, or other suitable process.

Figure 1I:
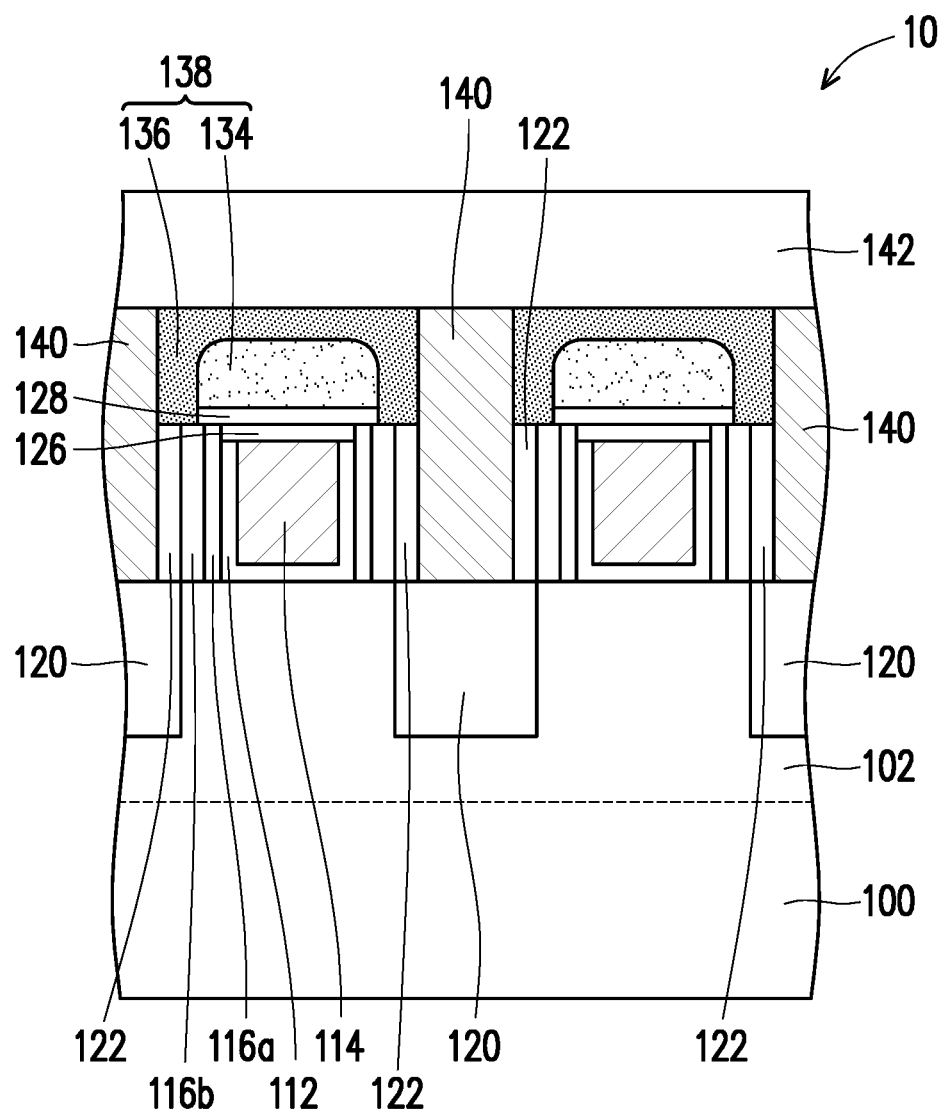

Referring to FIG. 1I, a plurality of conductive patterns 140 are formed over and electrically connected to the source-drain region 120. In some embodiments, each hard mask structure 138 is between the two adjacent conductive patterns 140. In some embodiments, the top surface of each hard mask structure 138 is substantially flush with or coplanar with top surfaces of the conductive patterns 140. In some embodiments, a plurality of openings are formed by removing the interlayer dielectric 124 and a portion of the CESL 122 therebeneath to expose portions of the source-drain region 120, and then a conductive material is filled in the openings to form the conductive patterns 140 electrically connected to the source-drain region 120. In other words, the interlayer dielectric 124 and the portion of the CESL 122 therebeneath are replaced by the conductive patterns 140, but the disclosure is not limited thereto. In some alternative embodiments, the conductive patterns 140 may be formed in the openings surrounded by the interlayer dielectric 124. The openings are formed by an etching process, such as dry etching process, wet etching process or a combination thereof, and the conductive material is formed by a sputtering process, a deposition process, such as atomic layer deposition (ALD), molecular beam deposition (MBD), chemical vapor deposition (CVD), physical vapor deposition (PVD), flowable chemical vapor deposition (FCVD), or a combination thereof, or any other suitable process. To be more specific, since the hard mask layer 136 of the hard mask structure 138 has the different etch selectivity from the interlayer dielectric 124, during the etching process for forming the openings, the hard mask layers 136 are used as self-aligned masks. That is, the etching process for forming the openings is referred to as a self-aligned etching process. Accordingly, due to the self-aligned formed openings, the conductive patterns 140 formed in the openings are self-aligned formed, and the process window of the conductive patterns 140 can be enlarged. In some embodiments, the conductive patterns 140 are referred to as "MD (metal drain)" contacts, and due to the above self-aligned process, the conductive patterns 140 also are referred to as self-aligned contacts. In some embodiments, the material of the conductive patterns 140 may include a metal, such as copper, titanium, tungsten, aluminum, any other suitable metal or a combination thereof. Moreover, the conductive patterns 140 may further include barrier layers.

Then, a dielectric layer 142 is formed on the hard mask structures 138 and the conductive patterns 140. In some embodiments, the material of the dielectric layer 142 may be SiO$_2$, SiN, SiON, SiCN, or any other suitable material. In some embodiments, the dielectric layer 142 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof. In some embodiments, the dielectric layer 142 has a thickness in the range of about 10 nanometers to about 40 nanometers. In some embodiments, the dielectric layer 142 is single-layer structure. In some alternative embodiments, the dielectric layer 142 is multi-layer structure.

Figure 1J:
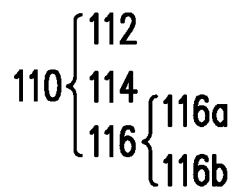
Figure 1J:
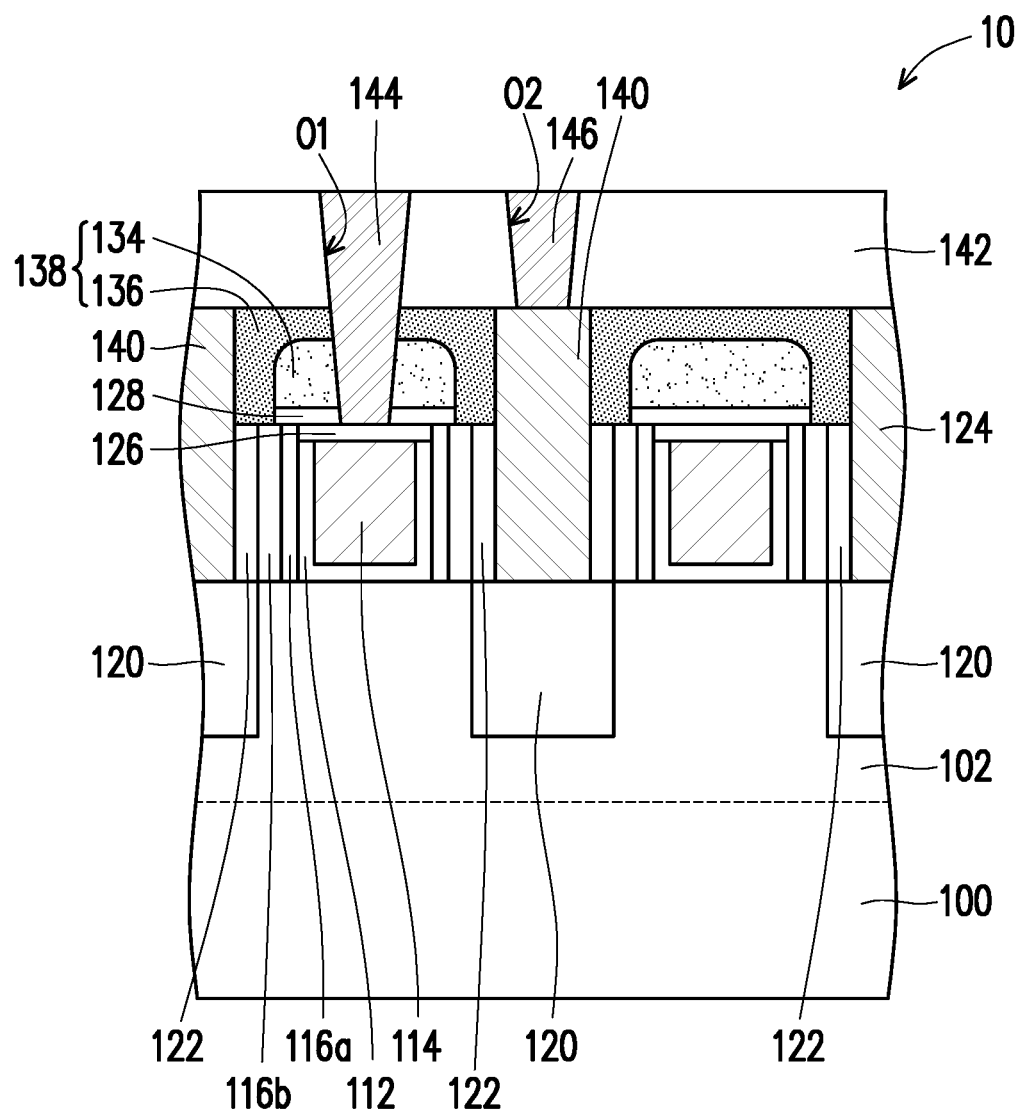

Referring to FIG. 1J, an opening O1 is formed in the dielectric layer 128, the hard mask layer 134, the hard mask layer 136 and the dielectric layer 142, an opening O2 is formed in the dielectric layer 142, and a plug 144 and a plug 146 respectively are formed in the opening O1 and the opening O2 and respectively are electrically connected to the gate structure 110 and the conductive pattern 140. That is, the opening O1 is configured for the plug 144 to be formed and electrically connected to the gate structure 110, and the opening O2 is configured for the plug 146 to be formed and electrically connected to the conductive pattern 140. Due to the opening O1 formed in the hard mask layer 134 and the hard mask layer 136, the plug 144 formed in the opening O1 is surrounded by the hard mask structure 138. In some embodiments, as shown in FIG. 1J, one opening O1 and one opening O2 are shown for illustration purpose, but the disclosure is not limited thereto. In some alternative embodiments, the number of the opening O1 and the number of the opening O2 may respectively be more than one.

In some embodiments, the opening O1 and the opening O2 may be formed by photolithography and etching processes. In some embodiments, the opening O1 and the opening O2 may be formed in different steps. However, in some alternative embodiments, the opening O1 and the opening O2 may be formed in the same step.

In some embodiments, the method of forming the plug 144 and the plug 146 may include: a deposition process and then a planarization process, a sputtering process and then a planarization process, or an electro-chemical plating process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. In some embodiments, the materials of the plug 144 and the plug 146 may respectively be conductive material, such as cobalt, tungsten, copper, titanium, tantalum, aluminum, zirconium, hafnium, or other suitable material. In some embodiments, the plug 144 contacts the conductive layer 126. That is, the plug 144 is electrically connected to the gate structure 110 through the conductive layer 126. In some embodiments, the plug 144 contacts the hard mask layer 134 and the hard mask layer 136. In some embodiments, the hard mask structure 138 is disposed between and insulates the plug 144 and the conductive patterns 140 adjacent to the plug 144, and thereby an isolation therebetween is improved. Similarly, each hard mask structure 138 is disposed between and insulates the plug 146 and the corresponding gate structure 110 adjacent to the plug 146, and thereby an isolation therebetween is improved.

In the embodiments of FIG. 1A to FIG. 1J, the modification process M is performed to form the hard mask layers 134. However, the disclosure is not limited thereto. In some alternative embodiments, the modification process M is omitted. The details will be described below with reference to FIG. 2A to FIG. 2I.

FIG. 2A to FIG. 2I are cross-sectional views at various stages of forming a semiconductor device 20 in accordance with some embodiments of the present disclosure. The elements similar to or substantially the same as the elements described previously will use the same reference numbers, and certain details or descriptions (e.g. the relative configurations or electrical connections, and the formations and materials) of the same elements may not be repeated herein.

Figure 2A:
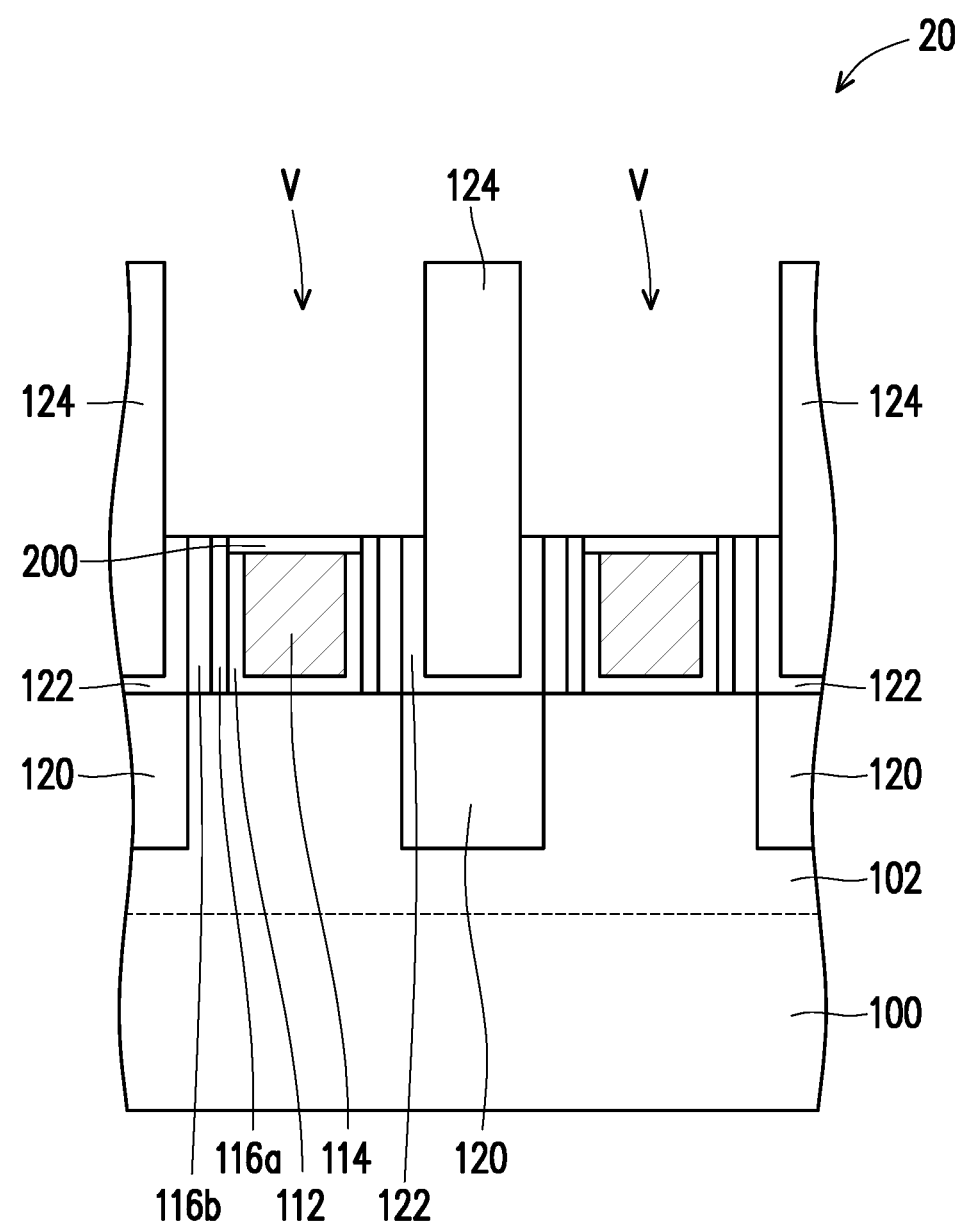
FIGS. 2A to 2I are cross-sectional views at various stages of forming a semiconductor device in accordance with some embodiments of the present disclosure.

Referring to FIG. 2A, a structure same as the structure of FIG. 1A is provided, and portions of the gate dielectric layers 112, the gate electrodes 114, the spacers 116 and the CESL 122 are removed, so as to form recesses V exposing portions of the interlayer dielectric 124. In some embodiments, after the removing process is performed, each gate dielectric layer 112 has a top surface not substantially flush with or coplanar with the top surface of the interlayer dielectric 124, each gate structure 110 has a top surface not substantially flush with or coplanar with the top surface of the interlayer dielectric 124, and the CESL 122 has a top surface not substantially flush with or coplanar with the top surface of the interlayer dielectric 124. In some embodiments, specifically, each gate structure 110 has a top surface lower than the top surface of the interlayer dielectric 124, and the CESL 122 has a top surface lower than the top surface of the interlayer dielectric 124. In some embodiments, additionally, after the removing process is performed, the top surface of each spacer 116 is not substantially flush with or coplanar with the top surface of each gate dielectric layer 112 and the top surface of each gate electrode 114. However, the disclosure is not limited thereto; in some alternative embodiments, after the removing process is performed, the top surface of each spacer 116 is substantially flush with or coplanar with the top surface of each gate dielectric layer 112 and the top surface of each gate electrode 114. In some embodiments, after the removing process is performed, the top surface of the CESL 122 is substantially flush with or coplanar with the top surface of each spacer 116. However, the disclosure is not limited thereto; in some alternative embodiments, after the removing process is performed, the top surface of CESL 122 is not substantially flush with or coplanar with the top surface of each spacer 116.

In some embodiments, the gate dielectric layers 112, the gate electrodes 114, the spacers 116 and the CESL 122 may be removed by etching. In some embodiments, the removing process may include one or more than one etching processes. In some embodiments, the gate dielectric layers 112, the gate electrodes 114, the spacers 116 and the CESL 122 are removed simultaneously by the same etchant. In some alternative embodiments, the gate dielectric layers 112, the gate electrodes 114, the spacers 116 and the CESL 122 are removed by different etchants. In addition, during the removing process, the interlayer dielectric 124 are not removed with respect to the removals of the gate dielectric layers 112, the gate electrodes 114, the spacers 116 and the CESL 122 due to the specific etching selectivity chosen based on the material differences.

After the portions of the gate dielectric layers 112, the gate electrodes 114, the spacers 116 and the CESL 122 are removed, a conductive layer 200 is formed to cover the gate dielectric layers 112 and the gate electrodes 114. In some embodiments, the conductive layer 200 has a top surface substantially flush with or coplanar with the top surface of each spacer 116. However, the disclosure is not limited thereto; in some alternative embodiments, the conductive layer 200 has a top surface not substantially flush with or coplanar with the top surface of each spacer 116. In some embodiments, the material of the conductive layer 200 includes titanium (Ti), tantalum (Ta), tungsten (W), aluminum (Al), titanium aluminum (TiAl), tantalum aluminum (TaAl), tungsten aluminum (WAl), zirconium aluminum (ZrAl), tungsten silicon nitride (WSiN), titanium aluminum carbide (TiAlC), tantalum aluminum carbide (TaAlC), titanium aluminum nitride (TiAlN), tantalum aluminum nitride (TaAlN), or other suitable material. In some embodiments, the material of the conductive layer 126 includes tungsten. In some alternative embodiments, the conductive layer 200 is optional, that is, the conductive layer 200 may be omitted.

Figure 2B:
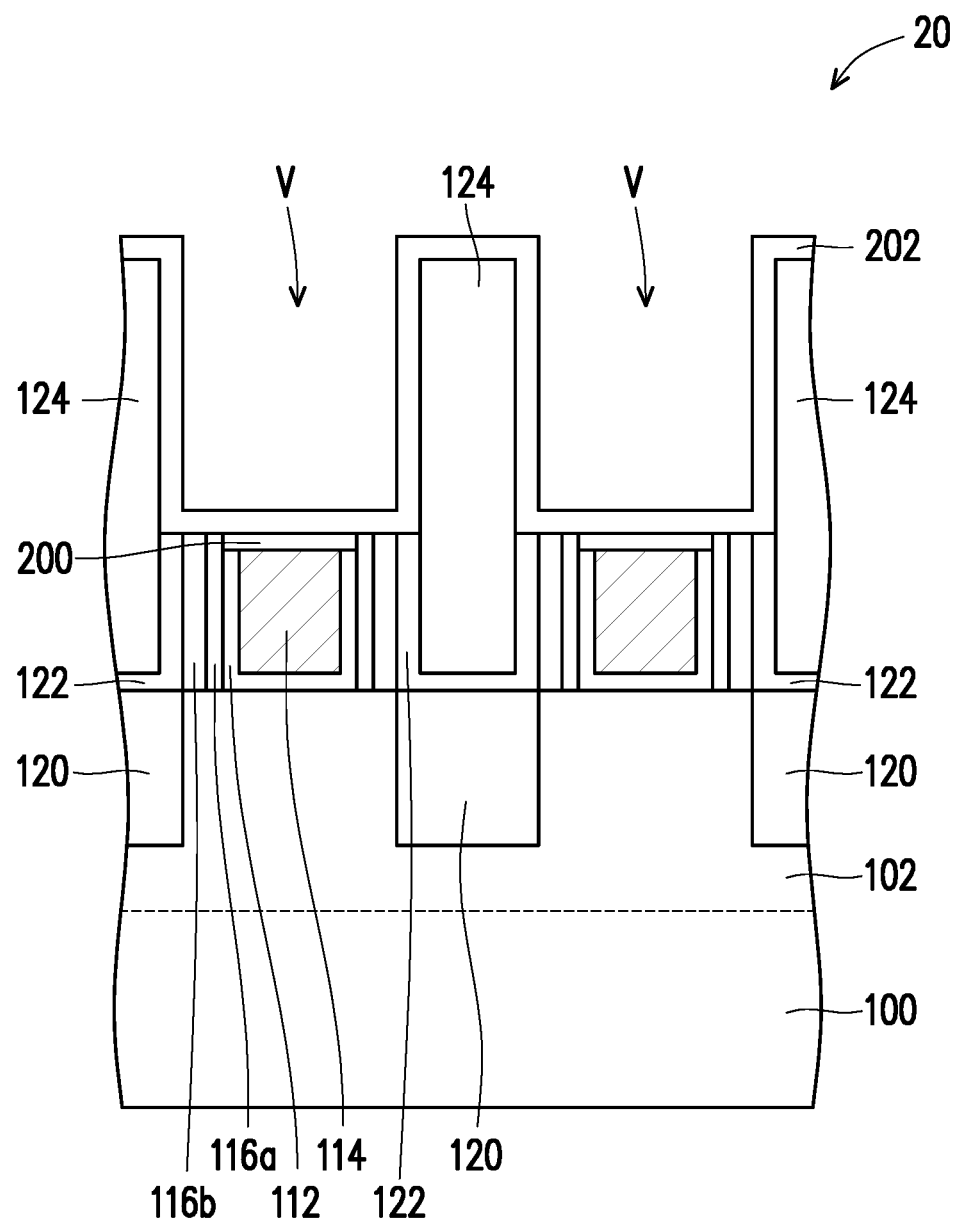

Referring to FIG. 2B, a dielectric layer 202 is formed in the recesses V and over the exposed surfaces of the CESL 122, the interlayer dielectric 124, the gate structure 110 and the conductive layer 200. That is, after the recesses V are formed, the dielectric layer 202 is conformally formed over the substrate 100. In some embodiments, the material of the dielectric layer 202 is different from the material of the interlayer dielectric 124. In some embodiments, the dielectric layer 202 has a different etch selectivity from the interlayer dielectric 124. In some embodiments, the material of the dielectric layer 202 includes amorphous silicon, polycrystalline silicon, or other suitable material. In some embodiments, the material of the dielectric layer 202 may be amorphous silicon. In some embodiments, the dielectric layer 202 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof. In some embodiments, the dielectric layer 202 has a thickness in the range of about 1 nanometer to about 5 nanometers.

Figure 2C:
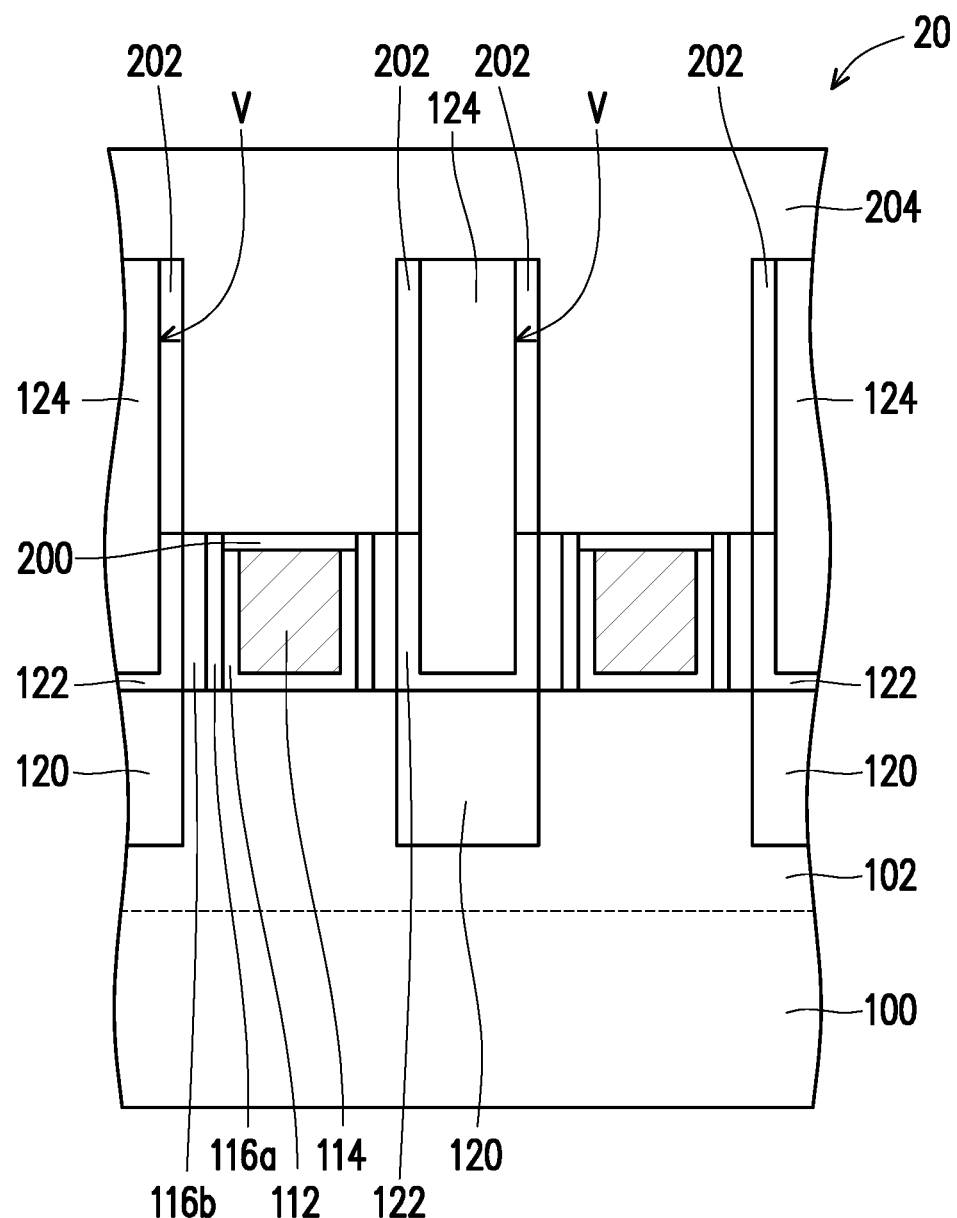

Referring to FIG. 2C, the dielectric layer 202 is partially removed to expose the top surface of the interlayer dielectric 124, the top surface of each spacer 116 and the top surface of the conductive layer 200. In some embodiments, the dielectric layer 202 may be removed by an etching process. The etching process may include an anisotropic etching process or other suitable process. To be more specific, portions of the dielectric layer 202 located on the top surface of the interlayer dielectric 124, the top surface of each spacer 116 and the top surface of the conductive layer 200 are etched off but portions of the dielectric layer 202 located on the sidewalls of the recesses V are remained. In some embodiments, the dielectric layer 202 only covers the top surface of CESL 122. In some embodiments, the dielectric layer 202 is entirely overlapped with and has a same thickness of the CESL 122 therebeneath, for example. However, the disclosure is not limited thereto; in some alternative embodiments, the dielectric layer 202 may cover the top surface of CESL 122 and the top surface of each spacer 116. As shown in FIG. 2C, after the dielectric layer 202 is partially removed, the top surface of each spacer 116 is maintained substantially flush with or coplanar with the top surface the conductive layer 200. However, the disclosure is not limited thereto; in some alternative embodiments, each spacer 116 is partially removed while the dielectric layer 202 is partially removed to have a top surface lower than the top surface the conductive layer 200.

Then, a material layer 204 is formed to fill up the recesses V and cover the top surface of the interlayer dielectric 124. In some embodiments, the material of the material layer 204 is different from the material of the dielectric layer 202 and the material of the interlayer dielectric 124. In some embodiments, the material layer 204 has a different etch selectivity from the dielectric layer 202 and the interlayer dielectric 124. In some embodiments, the material of the material layer 204 includes oxide, nitride or oxy-nitride. In some embodiments, the material of the material layer 204 includes SiN, SiCON, SiON, SiCN or other suitable material. In some embodiments, the material of the material layer 204 may be SiN. In some embodiments, the material layer 130 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof.

Figure 2D:
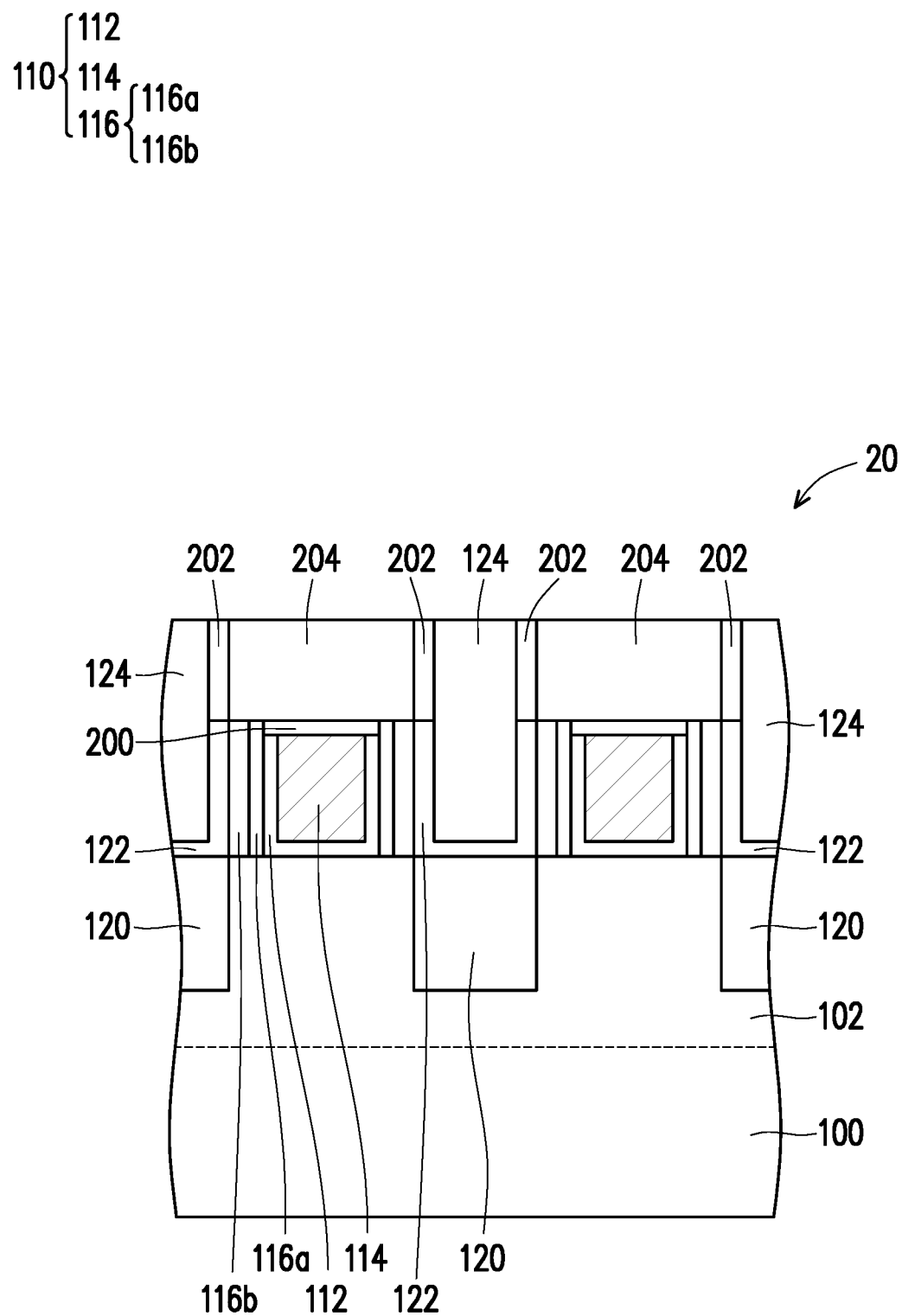

Referring to FIG. 2D, portions of the material layer 204, the dielectric layer 202 and the interlayer dielectric 124 are removed, until a top surface of the material layer 204, a top surface of the dielectric layer 202 and a top surface of the interlayer dielectric 124 are substantially flush with or coplanar with each other. In some embodiments, the material layer 204, the dielectric layer 202 and the interlayer dielectric 124 may be removed by a planarization process. The planarization process may include a chemical mechanical polishing (CMP) process, an etch process, or other suitable process.

Figure 2E:
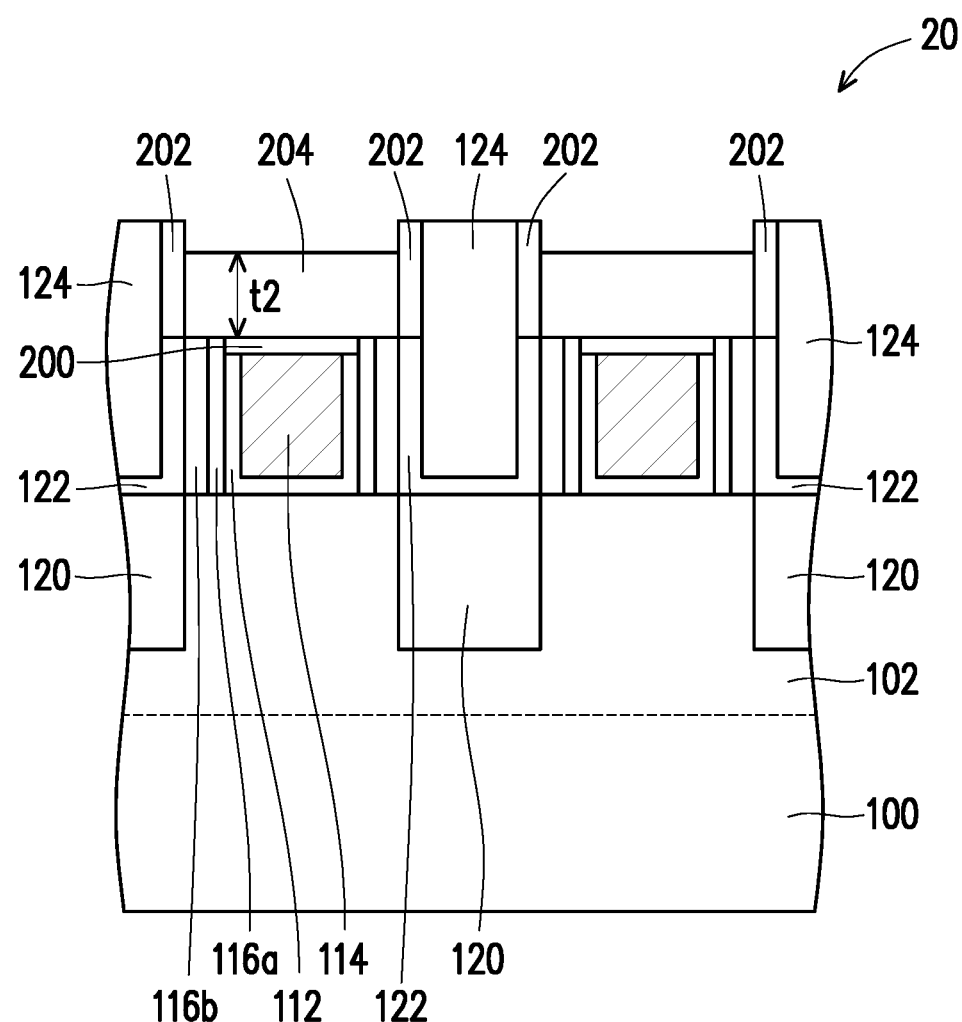

Referring to FIG. 2E, the material layer 204 is further partially removed to have a thickness t1, until the material layer 204 has a top surface lower than the top surface of the dielectric layer 202 and the top surface of the interlayer dielectric 124. In some embodiments, the material layer 204 may be removed by an etching process. Since the material layer 204 the different etch selectivity from the dielectric layer 202 and the interlayer dielectric 124, during the etching process, the dielectric layer 202 and the interlayer dielectric 124 are not removed with respect to the removal of the material layer 204. In some embodiments, the etching process may include a dry etching process with using fluorine-based gas, or chlorine-based gas as reaction gas. In some alternative embodiments, the etching process may include a wet etching process with $H_3PO_4$.

Figure 2F:
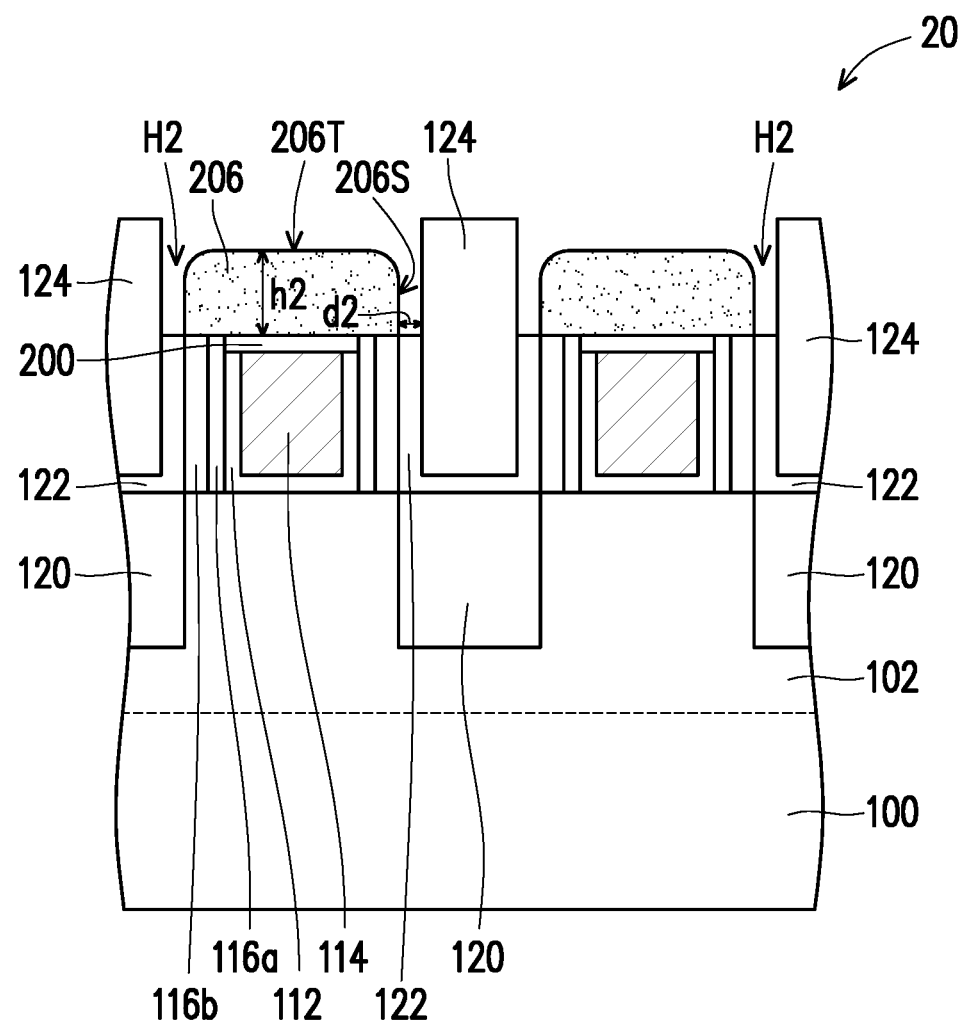

Referring to FIG. 2F, the dielectric layer 202 is removed, so as to form hard mask layers 206 over the gate structures 110 and hollow portions H2 between the hard mask layers 206 and the interlayer dielectric 124. In some embodiments, the hollow portions H2 expose top surfaces 206T and sidewalls 206S of the hard mask layers 206 and the top surface of the CESL 122. In some embodiments, the top surface 206T and the sidewall 206S are connected at a top corner. In some embodiments, the dielectric layer 202 may be removed by an etching process. In some embodiments, each top corner of each hard mask layer 206 is rounded in the range of about ⅓ Π rad to about ½ Π rad (about 60 degrees to about 90 degrees), each hard mask layer 206 covers the whole top surface of the corresponding spacer 116, and a distance d2 of about 1 nanometer to about 7 nanometers is between a sidewall of the interlayer dielectric 124 and the sidewall 206S of each hard mask layer 206. In some embodiments, the distance d2 is substantially the same as the thickness of the CESL 122 on the sidewall of the spacer 116. To be more specific, since the material layer 204 has the different etch selectivity from the dielectric layer 202, during the etching process, the material layer 204 is partially removed to form the hard mask layers 206 with rounded top corners, while the dielectric layer 202 over the top surface of the top surface of CESL 122 is removed. However, the disclosure is not limited thereto. In some alternative embodiments, at least one top corner of the hard mask layers 206 may be rounded. In some alternative embodiments, the corners of the patterns 132 may not be rounded, which means each corner of the patterns 132 may be sharp corner. In some alternative embodiments, each hard mask layer 206 partially covers the top surface of the corresponding spacer 116. In some alternative embodiments, the distance d2 of about 1 nanometer to about 3 nanometers is between the sidewall of the interlayer dielectric 124 and the sidewall 206S of each hard mask layer 206. In some embodiments, the material of the hard mask layers 206 includes oxide, nitride or oxy-nitride. In some embodiments, the material of the hard mask layers 206 includes SiN, SiCON, SiON, SiCN or other suitable material. In some embodiments, the material of the hard mask layers 206 may be SiN. In some embodiments, each hard mask layer 206 has a thickness h2 in the range of about 5 nanometers to 30 about nanometers. In some embodiments, the thickness h2 of each hard mask layer 206 is substantially equal to the thickness t1 of the material layer 204. However, the disclosure is not limited thereto; in some alternative embodiments, after the removing process is performed, the thickness h2 of each hard mask layer 206 is lower than the thickness t1 of the material layer 204. In some embodiments, the top surface 206T of each hard mask layer 206 is higher than the top surface of the CESL 122. In addition, since the interlayer dielectric 124 has the different etch selectivity from the dielectric layer 202, during the etching process, the interlayer dielectric 124 is not removed with respect to the removal of the dielectric layer 202. In some embodiments, the etching process may include a dry etching process with using fluorine-based gas, chlorine-based gas as reaction gas. In some alternative embodiments, the etching process may include a wet etching process with $NH_4OH$.

Figure 2G:
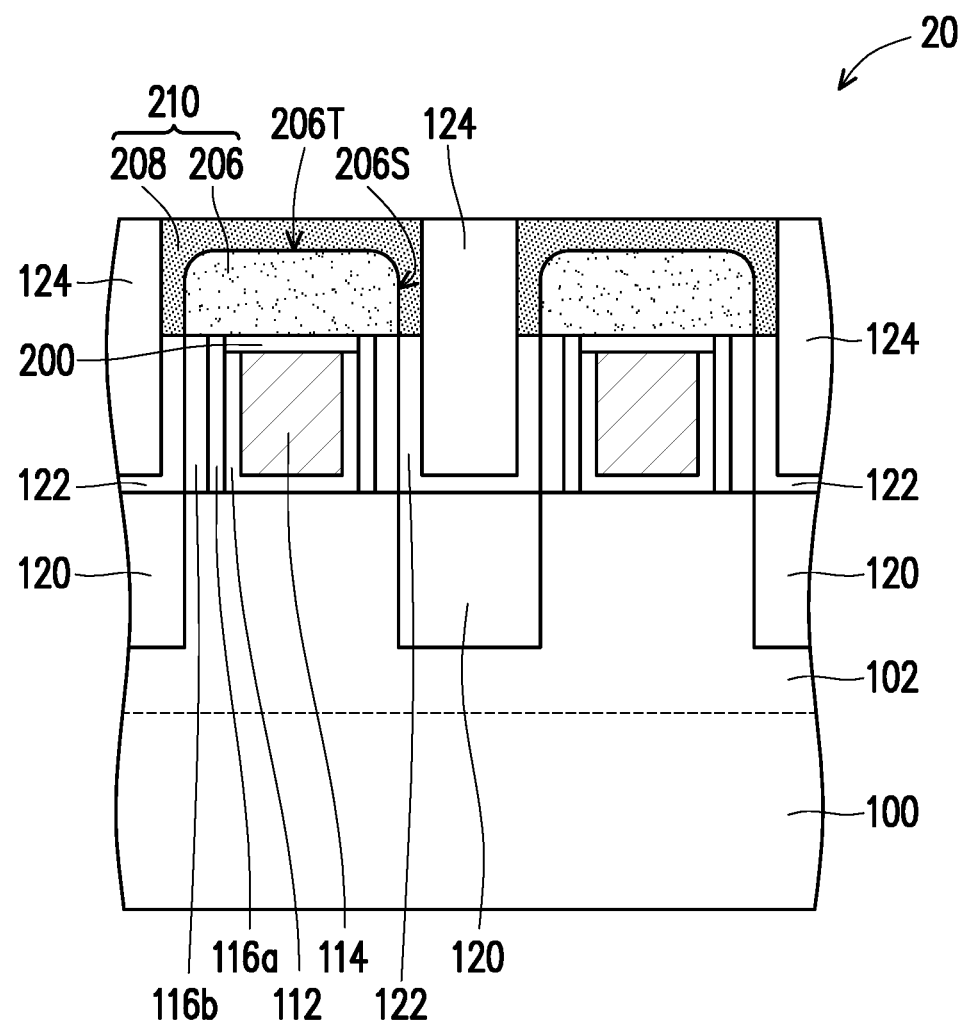

Referring to FIG. 2G, hard mask layers 208 are formed in the hollow portions H2 to cover the top surfaces 206T and the sidewalls 206S of the hard mask layers 206, and the hard mask layers 208 with the hard mask layers 206 together constitute hard mask structures 210. In other words, each of the hard mask structures 210 includes one hard mask layer 206 and one hard mask layer 208. In some embodiments, the hard mask structures 210 are disposed over the gate structures 110. In some embodiments, a top surface of each hard mask structure 210 is substantially flush with or coplanar with a top surface of the interlayer dielectric 124, wherein the top surface of each hard mask structure 210 is a top surface of the corresponding hard mask layer 208. In some embodiments, the material of the hard mask layer 208 is different from the material of the hard mask layer 206. In some embodiments, a k constant of the material of the hard mask layer 206 is lower than a k constant of the material of the hard mask layer 208. In some embodiments, the hard mask layer 208 has a different etch selectivity from the interlayer dielectric 124. In some embodiments, the material of the hard mask layer 208 includes $ZrO_2$, $HfO_2$, $Al_2O_3$, $Y_2O_3$ or other suitable material. In some embodiments, the material of the hard mask layer 208 may be $ZrO_2$. Owing to the hard mask layer 206 and the hard mask layer 208, the semiconductor device 20 has the reduced capacitance, thereby enhancing the electric performance of the semiconductor device 20. In some embodiments, the method of forming the hard mask layers 208 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may be performed by using the top surface of the interlayer dielectric 124 as a stop layer and may include a chemical mechanical polishing (CMP) process, an etch process, or other suitable process.

Figure 2H:
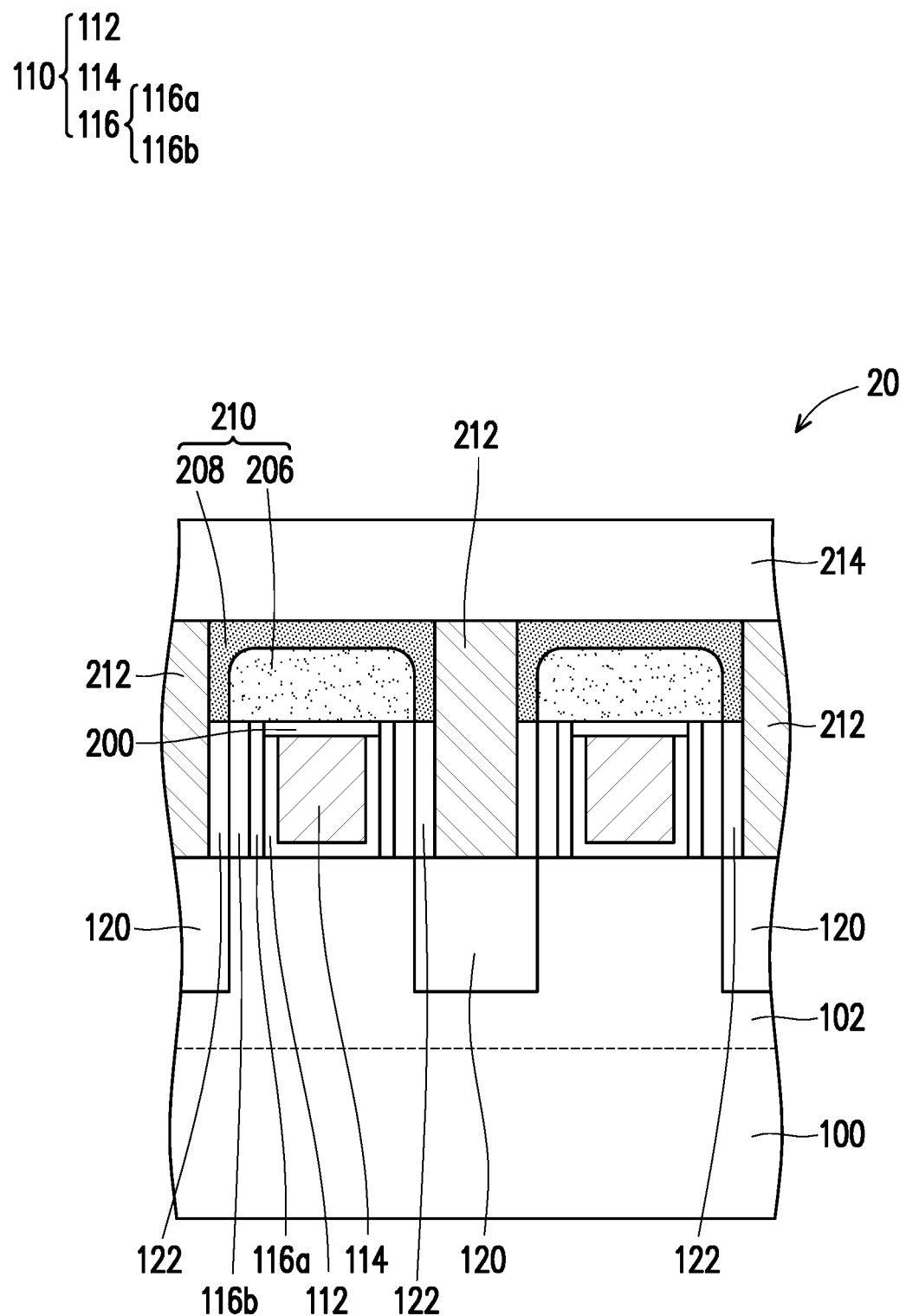

Referring to FIG. 2H, a plurality of conductive patterns 212 are formed over and electrically connected to the source-drain region 120. In some embodiments, each hard mask structure 210 is between the two adjacent conductive patterns 212. In some embodiments, the top surface of each hard mask structure 210 is substantially flush with or coplanar with top surfaces of the conductive patterns 212. In some embodiments, a plurality of openings are formed by removing the interlayer dielectric 124 and a portion of the CESL 122 therebeneath to expose portions of the source-drain region 120, and then a conductive material is filled in the openings to form the conductive patterns 212 electrically connected to the source-drain region 120. In other words, the interlayer dielectric 124 and the portion of the CESL 122 therebeneath are replaced by the conductive patterns 212, but the disclosure is not limited thereto. In some alternative embodiments, the conductive patterns 212 may be formed in the openings surrounded by the interlayer dielectric 124. The openings are formed by an etching process, such as dry etching process, wet etching process or a combination thereof, and the conductive material is formed by a sputtering process, a deposition process, such as atomic layer deposition (ALD), molecular beam deposition (MBD), chemical vapor deposition (CVD), physical vapor deposition (PVD), flowable chemical vapor deposition (FCVD), or a combination thereof, or any other suitable process. To be more specific, since the hard mask layer 208 of the hard mask structure 210 has the different etch selectivity from the interlayer dielectric 124, during the etching process for forming the openings, the hard mask layers 208 are used as self-aligned masks. That is, the etching process for forming the openings is referred to as a self-aligned etching process. Accordingly, due to the self-aligned formed openings, the conductive patterns 212 formed in the openings are self-aligned formed, and the process window of the conductive patterns 212 can be enlarged. In some embodiments, the conductive patterns 212 are referred to as "MD (metal drain)" contacts, and due to the above self-aligned process, the conductive patterns 212 also are referred to as self-aligned contacts. In some embodiments, the material of the conductive patterns 212 may include a metal, such as copper, titanium, tungsten, aluminum, any other suitable metal or a combination thereof. Moreover, the conductive patterns 212 may further include barrier layers.

Then, a dielectric layer 214 is formed on the hard mask structures 210 and the conductive patterns 212. In some embodiments, the material of the dielectric layer 214 may be $SiO_2$, SiN, SiON, SiCN, or any other suitable material. In some embodiments, the dielectric layer 214 is formed by using a suitable process such as atomic layer deposition (ALD), molecular beam deposition (MBD), chemical vapor deposition (CVD), physical vapor deposition (PVD), flowable chemical vapor deposition (FCVD), or a combination thereof. In some embodiments, the dielectric layer 214 has a thickness in the range of about 10 nanometers to about 40 nanometers. In some embodiments, the dielectric layer 214 is single-layer structure. In some alternative embodiments, the dielectric layer 214 is multi-layer structure.

Figure 2I:
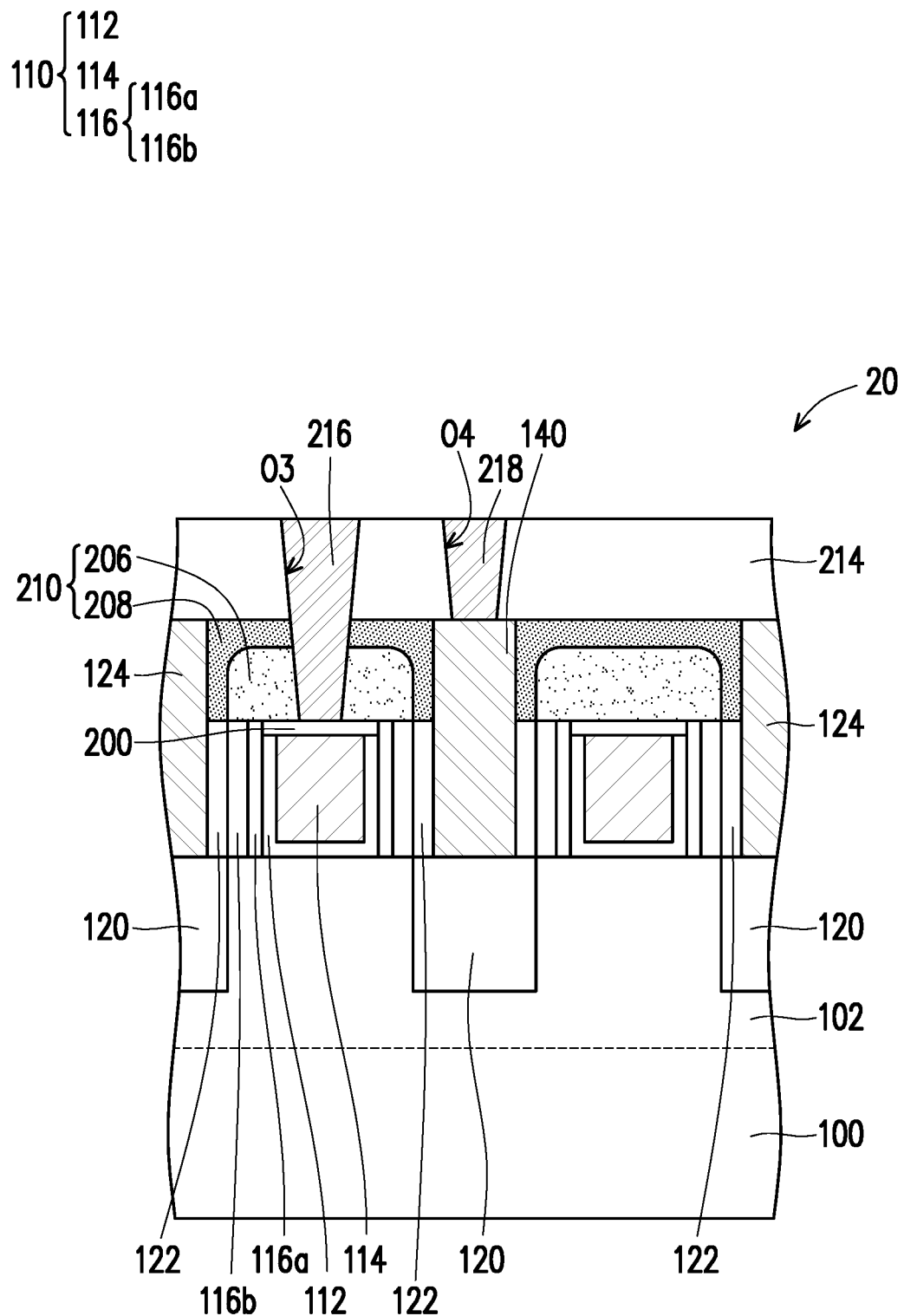

Referring to FIG. 2I, an opening O3 is formed in the dielectric layer 214, the hard mask layer 206 and the hard mask layer 208, an openings O4 is formed in the dielectric layer 214, and a plug 216 and a plug 218 respectively are formed in the opening O3 and the opening O4 and respectively are electrically connected to the gate structure 110 and the conductive pattern 212. That is, the opening O3 is configured for the plug 216 to be formed and electrically connected to the gate structure 110, and the opening O4 is configured for the plug 218 to be formed and electrically connected to the conductive pattern 212. Due to the opening O3 formed in the hard mask layer 206 and the hard mask layer 208, the plug 216 formed in the opening O3 is surrounded by the hard mask structure 210. In some embodiments, as shown in FIG. 2H, one opening O3 and one opening O4 are shown for illustration purpose, but the disclosure is not limited thereto. In some alternative embodiments, the number of the opening O3 and the number of the opening O4 may respectively be more than one.

In some embodiments, the opening O3 and the opening O4 may be formed by photolithography and etching processes. In some embodiments, the opening O3 and the opening O4 may be formed in different steps. However, in some alternative embodiments, the opening O3 and the opening O4 may be formed in the same step.

In some embodiments, the method of forming the plug 216 and the plug 218 may include: a deposition process and then a planarization process, a sputtering process and then a planarization process, or an electro-chemical plating process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. In some embodiments, the materials of the plug 216 and the plug 218 may respectively be conductive material, such as cobalt, tungsten, copper, titanium, tantalum, aluminum, zirconium, hafnium, or other suitable material. In some embodiments, the plug 216 contacts the conductive layer 200. That is, the plug 216 is electrically connected to the gate structure 110 through the conductive layer 200. In some embodiments, the plug 216 contacts the hard mask layer 206 and the hard mask layer 208. In some embodiments, the hard mask structure 210 is disposed between and insulates the plug 216 and the conductive patterns 212 adjacent to the plug 216, and thereby an isolation therebetween is improved. Similarly, each hard mask structure 210 is disposed between and insulates the plug 218 and the corresponding gate structure 110 adjacent to the plug 218, and thereby an isolation therebetween is improved.

Figure 3:
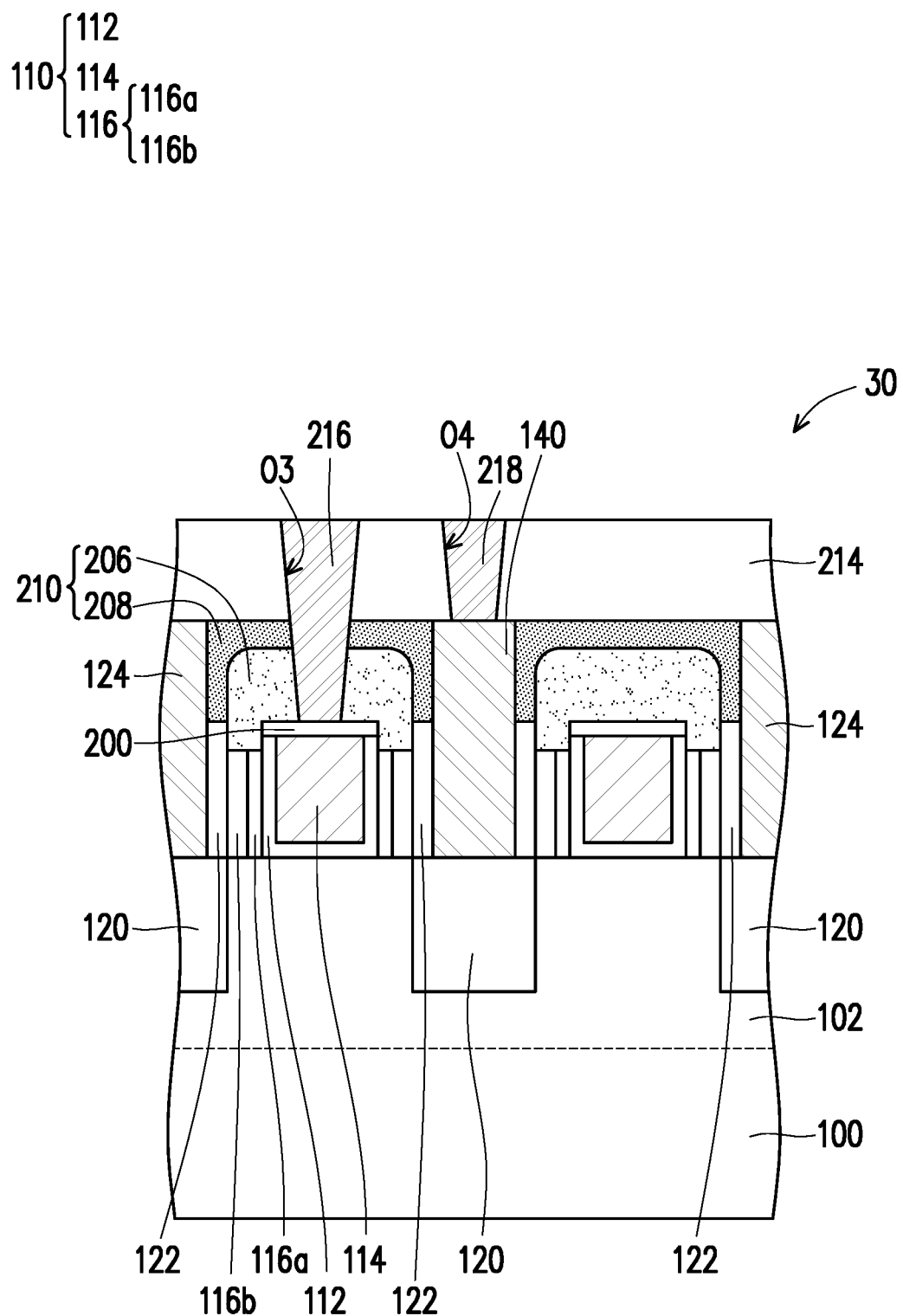
FIG. 3 is a cross-sectional view illustrating a semiconductor device in accordance with some embodiments of the present disclosure.

FIG. 3 is a cross-sectional view illustrating a semiconductor device 30 in accordance with some embodiments of the present disclosure. Referring to FIG. 3 and FIG. 2I, the semiconductor device 30 is similar to the semiconductor device 20 illustrated in FIG. 2I, except the main difference therebetween lies: in the semiconductor device 30, the top surface of each spacer 116 is lower than the top surface the conductive layer 200; while in the semiconductor device 20, the top surface of each spacer 116 is substantially flush with or coplanar with the top surface the conductive layer 200. That is, the forming method of the semiconductor device 30 is similar to the forming method of the semiconductor device 20, except in the step of partially removing the dielectric layer 202 to expose the top surface of the interlayer dielectric 124, as shown in FIG. 2C, each spacer 116 is also partially removed. As such, the detailed descriptions of the forming method of the semiconductor device 30 and some detailed descriptions of the structure of the semiconductor device 30 are referred to the foregoing embodiments and will not be repeated hereinafter.

In accordance with some embodiments of the disclosure, a semiconductor device includes a fin structure, a gate electrode, a source-drain region, a plug and a hard mask structure. The gate electrode crosses over the fin structure. The source-drain region is in the fin structure aside the gate electrode. The plug is disposed over and electrically connected to the gate electrode. The hard mask structure surrounds the plug and is disposed over the gate electrode, wherein the hard mask structure comprises a first hard mask layer and a second hard mask layer, the second hard mask layer covers a sidewall and a top surface of the first hard mask layer, and a material of the first hard mask layer is different from a material of the second hard mask layer.

In accordance with alternative embodiments of the disclosure, a semiconductor device includes a fin structure, a gate structure, a source-drain region, a plug, a contact etch stop layer and a hard mask structure. The gate structure crosses over the fin structure, wherein the gate structure comprises a gate electrode and a spacer located over sidewalls of the gate electrode. The source-drain region is in the fin structure aside the gate structure. The plug is disposed over and electrically connected to the gate structure. The contact etch stop layer is aside the gate structure. The hard mask structure surrounds the plug and covers the gate structure and the contact etch stop layer, wherein the hard mask structure comprises a first hard mask layer and a second hard mask layer, the second hard mask layer covers a sidewall and a top surface of the first hard mask layer, a k constant of a material of the first hard mask layer is lower than a k constant of a material of the second hard mask layer, and the second hard mask layer contacts the plug.

In accordance with yet alternative embodiments of the disclosure, a method of forming a semiconductor device includes the following steps. A gate electrode crossing over a fin structure is formed, wherein a source-drain region is in the fin structure aside the gate electrode. A portion of the gate electrode is removed. A hard mask structure over the gate electrode is formed, wherein the hard mask structure comprises a first hard mask layer and a second hard mask layer, the second hard mask layer covers a sidewall and a top surface of the first hard mask layer, and a material of the first hard mask layer is different from a material of the second hard mask layer. A plug over the gate electrode is formed, wherein the hard mask structure surrounds the plug.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate;
   a gate structure over the substrate;
   a plug disposed over and electrically connected to the gate structure; and
   a hard mask structure over the gate structure, comprising a first hard mask layer and a second hard mask layer, wherein the first hard mask layer surrounds and is in contact with the plug, the second hard mask layer surrounds the first hard mask layer and has a bottom surface at the same level height as a bottom surface of the plug, the second hard mask layer contacts and covers a top surface of the first hard mask layer, and a material of the first hard mask layer is different from a material of the second hard mask layer, and wherein a bottom surface of the first hard mask layer is spaced apart from the second hard mask layer, and a portion of a bottom surface of the second hard mask layer is spaced apart from the first hard mask layer.

2. The semiconductor device as claimed in claim 1, wherein a k constant of the material of the first hard mask layer is lower than a k constant of the material of the second hard mask layer.

3. The semiconductor device as claimed in claim 1, wherein the material of the first hard mask layer comprises SiN, and the material of the second hard mask layer comprises $ZrO_2$.

4. The semiconductor device as claimed in claim 1, wherein the bottom surface of the second hard mask layer is lower than a bottom surface of the first hard mask layer.

5. The semiconductor device as claimed in claim 1, wherein the bottom surface of the second hard mask layer is substantially flush with the bottom surface of the first hard mask layer.

6. The semiconductor device as claimed in claim 1, wherein the bottom surface of the second hard mask layer is higher than the bottom surface of the first hard mask layer.

7. A semiconductor device, comprising:
   a substrate;
   a gate structure over the substrate;
   a contact etch stop layer (CESL) aside the gate structure; and
   a hard mask structure over the gate structure, comprising a first hard mask layer and a second hard mask layer, wherein the second hard mask layer surrounds the first hard mask layer, the second hard mask layer contacts a top surface of the contact etch stop layer, and an outer sidewall of the second hard mask layer is flush with an outer sidewall of the contact etch stop layer.

8. The semiconductor device as claimed in claim 7, wherein the second hard mask layer is not integrally formed with the first hard mask layer.

9. The semiconductor device as claimed in claim 7, wherein the top surface of the contact etch stop layer is lower than a bottom surface of the first hard mask layer.

10. The semiconductor device as claimed in claim 7, wherein the top surface of the contact etch stop layer is substantially coplanar with a bottom surface of the first hard mask layer.

11. The semiconductor device as claimed in claim 7, wherein the top surface of the contact etch stop layer is higher than a bottom surface of the first hard mask layer.

12. The semiconductor device as claimed in claim 7, wherein the gate structure comprises a gate electrode and a spacer located over sidewalls of the gate electrode.

13. The semiconductor device as claimed in claim 12, further comprising a plug penetrating through the first hard mask layer and the second hard mask layer to electrically connect the gate electrode.

14. The semiconductor device as claimed in claim 12, wherein the first hard mask layer partially covers the top surface of the spacer.

15. A method of forming a semiconductor device, comprising:
   forming a gate structure over a substrate;
   forming a contact etch stop layer (CESL) aside the gate structure; and
   forming a hard mask structure over the gate structure, wherein the hard mask structure comprises a first hard mask layer and a second hard mask layer, the second hard mask layer surrounds the first hard mask layer, the second hard mask layer contacts a top surface of the contact etch stop layer, and an outer sidewall of the second hard mask layer is flush with an outer sidewall of the contact etch stop layer.

16. The method as claimed in claim 15, further comprising forming a plug over the gate structure, wherein the hard mask structure surrounds the plug.

17. The method as claimed in claim 15, wherein the gate structure comprises a gate electrode and a spacer aside the gate electrode, and the spacer is disposed between the contact etch stop layer and the gate electrode.

18. The method as claimed in claim 17, wherein a method of forming the hard mask structure comprises:
   forming a dielectric layer over the gate electrode;
   forming a material layer over the gate electrode, wherein a top surface of the material layer is lower than a top surface of the dielectric layer;
   removing the dielectric layer while partially removing the material layer to form the first hard mask layer and a hollow portion, wherein the hollow portion exposes a top surface and sidewalls of the first hard mask layer and a top surface of the contact etch stop layer; and
   forming the second hard mask layer in the hollow portion.

19. The method as claimed in claim 18, wherein an etch selectivity of the dielectric layer is different from an etch selectivity of the material layer.

20. The method as claimed in claim 18, wherein after the material layer is partially removed, a modification process is performed to form the first hard mask layer with a k constant lower than a material of the second hard mask layer.

* * * * *